United States Patent
Ernst et al.

(10) Patent No.: US 10,677,355 B2
(45) Date of Patent: Jun. 9, 2020

(54) TRIBOLOGICAL SYSTEM OF AN INTERNAL COMBUSTION ENGINE WITH A COATING

(71) Applicant: Oerlikon Surface Solutions AG, Pfäffikon, Pfäffikon (CH)

(72) Inventors: Peter Ernst, Stadel B. Niederglatt (CH); Jürgen Ramm, Maienfeld (CH); Florian Seibert, Leinfelden-Echterdigen (DE); Beno Widrig, Bad Ragaz (CH)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 16/077,235

(22) PCT Filed: Feb. 9, 2017

(86) PCT No.: PCT/EP2017/052887
§ 371 (c)(1),
(2) Date: Aug. 10, 2018

(87) PCT Pub. No.: WO2017/137500
PCT Pub. Date: Aug. 17, 2017

(65) Prior Publication Data
US 2019/0024795 A1    Jan. 24, 2019

Related U.S. Application Data

(60) Provisional application No. 62/294,488, filed on Feb. 12, 2016.

(51) Int. Cl.
*F16J 10/04*    (2006.01)
*C23C 14/08*    (2006.01)
(Continued)

(52) U.S. Cl.
CPC ............... *F16J 10/04* (2013.01); *C23C 4/11* (2016.01); *C23C 14/08* (2013.01); *C23C 14/325* (2013.01);
(Continued)

(58) Field of Classification Search
CPC ..... F16J 10/04; F16J 9/26; C23C 4/11; C23C 14/08; C23C 14/325; C23C 4/129; C23C 4/134; F02B 2023/0612
(Continued)

(56) References Cited

U.S. PATENT DOCUMENTS 5,985,427 A * 11/1999 Ueda ................ C23C 16/403
428/216
7,406,940 B2    8/2008 Nishimura et al.
(Continued)

FOREIGN PATENT DOCUMENTS

EP    1022351 B1    7/2000
EP    1340834 A2    9/2003
(Continued)

OTHER PUBLICATIONS

International Search Report and Written Opinion for International Application No. PCT/EP2017/052887, 8 pages.
(Continued)

*Primary Examiner* — Joseph J Dallo
*Assistant Examiner* — Yi-Kai Wang
(74) *Attorney, Agent, or Firm* — Frost Brown Todd LLC

(57) ABSTRACT

The present invention relates to a tribological system (1; 2) comprising a first body (102; 105) and a second body (101; 107), which each form a component of an internal combustion engine (100), in particular a piston (102), a piston ring (105) or a cylinder (101, 107), and the surfaces (112, 108, 113) of which have a first and a second material area (11, 12) which come into contact with each other at least in some
(Continued)

regions during operation and form a tribological contact, wherein the first and/or the second material area (11, 12) is formed as a layer on the basis of chromium oxide or aluminum chromium oxide. The invention also relates to an internal combustion engine (100) having such a system (1; 2).

19 Claims, 11 Drawing Sheets

(51) Int. Cl.
  *C23C 14/32* (2006.01)
  *F16J 9/26* (2006.01)
  *C23C 4/11* (2016.01)
  *F02B 23/06* (2006.01)
  *C23C 4/129* (2016.01)
  *C23C 4/134* (2016.01)

(52) U.S. Cl.
  CPC ............... *F16J 9/26* (2013.01); *C23C 4/129* (2016.01); *C23C 4/134* (2016.01); *F02B 2023/0612* (2013.01)

(58) Field of Classification Search
  USPC ........................................................ 123/193.6
  See application file for complete search history.

(56) References Cited

U.S. PATENT DOCUMENTS

| | | | | |
|---|---|---|---|---|
| 2006/0254418 | A1* | 11/2006 | Barbezat | C23C 4/11 92/170.1 |
| 2008/0090099 | A1* | 4/2008 | Ramm | C23C 14/027 428/699 |
| 2012/0009432 | A1* | 1/2012 | Cox | C23C 4/134 428/552 |
| 2013/0136907 | A1* | 5/2013 | Chen | B23B 27/148 428/216 |
| 2014/0225330 | A1* | 8/2014 | Saito | F16J 9/26 277/442 |
| 2014/0260959 | A1 | 9/2014 | Toth | |
| 2016/0138516 | A1* | 5/2016 | Moding | C23C 16/406 92/248 |
| 2016/0238133 | A1* | 8/2016 | Sato | C23C 28/322 |
| 2016/0305366 | A1* | 10/2016 | Da Rocha Mordente | F02F 1/004 |

FOREIGN PATENT DOCUMENTS

| | | |
|---|---|---|
| JP | S62-280339 A | 12/1987 |
| JP | 2006-328463 A | 12/2006 |
| WO | WO 2008/043606 A1 | 4/2008 |
| WO | WO 2015/128178 A1 | 9/2015 |

OTHER PUBLICATIONS

Chinese Office Action, The First Office Action, and First Search dated Mar. 2, 2020 for Application No. CN 201780010767.4, 9 pgs.

* cited by examiner

TRIBOLOGICAL SYSTEM OF AN INTERNAL COMBUSTION ENGINE WITH A COATING

TECHNICAL FIELD

The present invention relates in general and in particular to a tribological system with a first body and a second body, which each form a component of an internal combustion engine, in particular a piston, a piston ring or a cylinder, and the surfaces of which have a first and a second material area which are each formed as layers and come into contact with each other at least in some regions during operation and form a tribological contact.

The disclosure relates to both the layer materials which are used for producing the layers, and the methods, by means of which these layers are applied to the corresponding engine components. It also refers to the correspondingly coated engine components.

The disclosure additionally relates in particular to the selection of the combination of the layer materials with which the tribological partners are coated in the tribological system.

TECHNICAL BACKGROUND

The term 'internal combustion engine' shall here include all internal combustion engines, in particular reciprocating piston engines, which can be operated with fossil fuels, such as gasoline, diesel or gas fuels (CNG, LNG).

Increasing the operating temperatures in internal combustion engines with the aim of better utilization of the fuel and the use of additives, such as biofuels, place higher demands on the thermal and chemical stability of surfaces in gasoline, diesel and gas combustion engines. These higher demands can only be met to a limited extent or at great expense by a selection of the compact materials (also referred to as bulk materials) for the engine components.

The terms 'compact materials' or 'bulk materials' refer to the materials of the substrates to be coated in order to improve the surface properties thereof. They include all materials that can be coated: e.g. steel, Al, Inconel, etc., i.e. materials and engineering materials, from which the components of an internal combustion engine are produced. Among the steels, e.g. 42CrMo4 is a typical material, from which pistons are made.

One method for the cost-effective improvement of the properties of compact materials is the surface treatment thereof, for example by nitriding, physical vapor deposition (PVD) or by spraying coatings of powders or wires using thermal spraying methods (HVOF or plasma). These processes can be used to produce materials that cannot be produced as compact materials, or can only be produced with great effort, but which can drastically influence the wear, friction and corrosion of the compact material surfaces, even if the modification only affects a relatively thin area of the surface.

Normally, the surfaces of the tribological partners in an internal combustion engine consist of different materials or different compact materials, which are optimized for a certain service life in order to reduce the number of service cycles, i.e. the service life is adapted. In such cases, the material or the layer thickness is usually adjusted.

In addition to the desire to reduce wear, reducing the friction losses is another goal in the development of internal combustion engines. Also under this aspect, the targeted modification of the surface plays an important role in the tribological system. In addition to the mechanical properties of the surfaces and their adaptation to one another, the surface materials must also assume important functions, such as the wettability with the oils and a certain control of the chemical reactions of additives and surfaces, without becoming chemically unstable themselves. All these facts show that the optimization of the tribological system of an internal combustion engine is extremely complex and requires flexibility in the selection and coordination of the surfaces. Thin layers offer here a higher degree of flexibility than is the case with compact materials.

EP 1 022 351 B1 describes the coating of the inside of a cylinder, the cylinder running surface, wherein the layer is applied by plasma spraying. The mostly ferrous layer also contains FeO and Fe2O3 proportions, wherein the proportion of bound oxygen is between 1 and 4 wt %- and the Fe2O3 proportion is below 0.2 wt %. The admixture of oxide ceramic powders with a proportion of 5 to 50 wt % to the process gas is recommended as a particular advantage in order to achieve even better coefficients of friction. TiO2, Al2O3-TiO2 and Al2O3-ZrO2 are indicated as oxide ceramic powders.

EP 1 340 834 A2 claims a cylinder running surface layer for reciprocating piston engines, wherein this layer has been applied by a plasma spraying method. The layer produced in this way has a content between 0.5 and 8 wt % of bound oxygen and includes embedded FeO and Fe2O3 crystals. In addition, the layer has a porosity degree between 0.5 and 10% and is honed to a certain roughness. The pores in the layer form microchambers which serve as a reservoir for lubricant and which promote a uniform oil distribution in the tribological system.

WO 2015/128178 A1 describes the surface treatment of a piston ring, which consists of a combination of surface nitriding and PVD coating. The running surface of the piston ring to the cylinder running surface is coated with a CrN layer, preferably deposited by ion plating. All other surfaces are subjected to a nitriding process. The deposition of the PVD layer on the non-nitrided piston ring surface is primarily intended to prevent cracking in the coating.

US 2014/0260 959 A1 claims a coated piston ring made of iron-based material, on the surface of which a wear-resistant layer is deposited which contains Al5Fe2 and which has a high hardness. This document also claims a chemical composition of this layer consisting of 52 to 55 wt % Al and 45 to 48 wt % Fe.

U.S. Pat. No. 7,406,940 B2 describes a tribological system consisting of a piston and a cylinder running surface, wherein the piston also has recesses for piston rings which are in tribological contact with the cylinder liner. In addition, the piston skirt is designed in such a way that the surface thereof is provided with a trench structure to improve the lubricating film. The piston ring and piston skirt are also coated with a DLC layer to improve the sliding properties, above all in conjunction with and adapted to a variety of lubricants.

The examples show that surfaces are coated to reduce the wear thereof and reduce friction losses. A variety of coating materials can be used to achieve this goal. Different processes are employed to apply these materials to the substrate surfaces. Furthermore, the state of the art makes it clear that very different substrate materials have to be coated in order to achieve advantageous surface adjustments of the partners in the tribological contact under the respective conditions.

In some cases, the geometry of the component to be coated also dictates the coating process. This is the case, for example, when cylinder bores have to be coated. For such a coating of the inner part of this component, a spraying method is far more suitable than a PVD method. Even in cases where thicker layers of above 100 μm or even above 500 μm have to be deposited, such methods are far more effective than a PVD coating. The latter in rum has economic advantages for thinner layers in the range up to 10 μm or up to 30 μm if the substrates can be coated in a batch process.

Testing the layer pairings of a special tribological system with regard to wear and friction losses could, of course, best be carried out on the real internal combustion engine. However, these tests are too costly to carry them out for all possible material combinations. In addition, there would also be the risk that unknown material combinations could damage the internal combustion engine, which could result in the destruction of the entire test stand.

The above shows both the variety of possibilities and how difficult it is to make a selection of layers and layer pairings.

The object is therefore to provide an improved tribological system, in particular for internal combustion engines, in which two bodies each form components of an internal combustion engine and two material areas are formed on their surfaces, which touch each other at least in certain areas during operation and form a tribological contact. In particular, there is a need to improve tribological systems consisting of piston ring and cylinder or of cylinder and piston. The object is here also in particular to provide further materials or material combinations from which the material areas designed as layers can be produced.

SUMMARY

According to a first aspect, the present disclosure provides a tribological system having a first and a second body, which each form a component of an internal combustion engine, in particular a piston, a piston ring or a cylinder, and the surfaces of which have a first and a second material area which come into contact with each other at least in some regions during operation and form a tribological contact, wherein the first and/or the second material area are/is formed as a layer on the basis of chromium oxide or aluminum chromium oxide.

Further aspects and features follow from the dependent claims, the attached drawing and the following description of embodiments.

BRIEF DESCRIPTION OF THE DRAWING

Embodiments are now described by way of example and with reference to the attached drawing, wherein.

DESCRIPTION OF EMBODIMENTS

Figure 1:
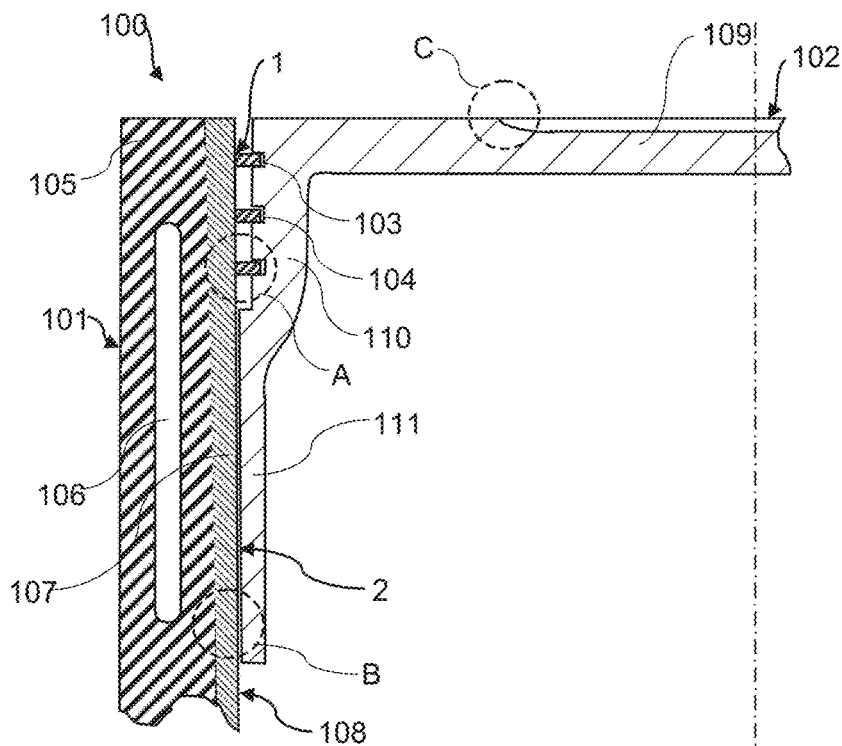
FIG. 1 shows a schematic sectional diagram with components from an internal combustion engine according to the invention, which includes tribological systems according to the invention.

General explanations on the embodiments are first made, followed by a detailed description of the embodiment with reference to the drawings.

An embodiment, in which the tribological system comprises a first body and a second body, which each form a component of an internal combustion engine, in particular a piston, a piston ring or a cylinder, and the surfaces of which comprise a first and a second material area which come into contact with each other at least in some regions during operation and form a tribological contact, wherein the first and/or the second material area is formed as a layer on the basis of chromium oxide or aluminum chromium oxide, has properties which are in particular favorable for the critical tribological systems that are near the combustion chamber in an internal combustion engine.

Layers on the basis of chromium oxide or aluminum chromium oxide can be applied in different processes to different materials, including compact materials that are typical for internal combustion engines.

Steel (e.g. quality 42CrMo4) is a typical material from which pistons are manufactured. Further typical materials for the pistons and their running surfaces at the piston connector (also piston skirt) are e.g. peritectic aluminum-silicon alloys with 11-13% Si and minor additions of Cu, Mg and Ni. There are also light metal composite materials, in which reinforcing elements, for example made of ceramics, carbon fibers and porous metallic materials, are specifically arranged in particularly highly stressed piston regions.

The cylinders are usually part of the crankcase and can be manufactured in monometallic design, e.g. from cast iron alloys or aluminum-silicon alloys. The running surfaces of such cylinders are formed directly on the material for casting.

In the so-called application technique, cylinder sleeves are inserted into the crankcase. In this case, the sleeves are made of GCI materials, aluminum materials or also aluminum-silicon alloys and are inserted or pressed, shrunk or cast into the crankcase in appropriately machined receptacles.

In the so-called composite technique, cylindrical shaped bodies made of a composite of suitable metallic and ceramic materials are inserted into the casting mold and infiltrated under high pressure by the aluminum alloy melt forming the crankcase.

The cylinder running surfaces of all cylinders are designed as tribological running partners and sealing surfaces for pistons and piston rings by fine boring or turning and subsequent honing.

A variety of designs and materials exist for the piston rings, which serve as a metallic seal and seal the combustion chamber against the crankcase. Steel or grey cast iron materials are widely used. In this case, it is also common practice to reinforce the ring running surfaces, which form a tribological system with the cylinder slide way, with wear-resistant protective layers. In addition to the already mentioned coatings for the ring running surfaces, chromium-plating, chrome-ceramic layers, chrome-diamond layers or molybdenum-based coatings are also provided. In nitriding or nitrocarburizing processes, nitrogen and in some cases also carbon can be incorporated into the surface of the piston ring by diffusion.

There are designs where the first and second material area, which are made as a coating, are each arranged on a surface of the components that forms a running surface. For the components, i.e. piston, piston ring or cylinder, these are the piston shaft slide ways on the piston, the ring running surfaces on the piston rings and the cylinder slide ways on the inside of the cylinders. These surfaces forming the respective running surfaces each form a tribological system according to the invention in pairs and can be designed as a layer on the basis of chromium oxide or aluminum chromium oxide.

There are designs where the first material area on a first body formed as a piston ring is a layer on the basis of aluminum chromium oxide with a chemical composition of $(Al_{1-x}Cr_{-y})_2O_3$, wherein: $0.1 \leq x \leq 1$ and $y \leq 0.5$; $0.5 \leq x \leq 1$ and $y \leq 0.5$ or $x=0.7$ and $y=0.3$. Such a coating shows positive tribological properties in both the dry state and the lubricated state for different friction partners (second material area on the cylinder running surface).

In other designs, the second material area on a second body formed as a cylinder is a mixed alumina-chromium oxide layer having a composition of 10 wt % to 100 wt % $Cr_2O_3$ and correspondingly 90 wt % to 0 wt % $Al_2O_3$. Such a layer is to be applied to a cylinder running surface by suitable coating methods (e.g. by means of thermal spraying) and is a good tribological partner for another layer on the basis of aluminum chromium oxide (formed by the first material area) with the above indicated composition of $(Al_{1-x}Cr_{-y})_2O_3$.

There are designs where the tribological properties can be further improved by favorably influencing the surface roughness. Here, the following values for the surface roughness Ra in μm apply to the first material areas: $0.1 \leq Ra \leq 0.5$; $0.15 \leq Ra \leq 0.4$; Ra=0.15 or Ra=0.4 and the following values apply to the second material areas: $0.1 \leq Ra \leq 0.5$; $0.15 \leq Ra \leq 0.45$; Ra=0.15 or Ra=0.45.

There are designs where the material areas are formed by means of a thermal spraying method. A spray material (this can be e.g. a powder mixture with different components, such as $Al_2O_3$ and $Cr_2O_3$) is introduced into a concentrated, high-energy heat source, where it is fused or partially melted and thrown at high speed onto the surface of the substrate to be coated in the form of spray particles. This process is particularly suitable for coating larger surfaces such as the cylinder running surface or also the piston shaft slide way. Common methods are flame spraying, high-speed flame spraying (HVOF), so-called cold gas spraying, arc spraying and plasma spraying. The resulting composition of the layer corresponds approximately to the composition of the starting material (the powder mixture).

In thermal spraying, layer thicknesses are between 50 mm and 400 mm, in particular also between 150 μm and 800 μm.

There are also designs where one of the materials is formed by means of a PVD method (physical vapor deposition) and in particular by means of cathodic spark evaporation. In the known PVD methods, the deposition of ions, atoms or molecules from the gas phase or plasma produces tribological protective layers on the surface of the substrate (base material of the component to be coated). For this purpose, the required starting materials (e.g. metals, ceramics, etc.) are thermally evaporated or atomized and condensed again on the components.

Both the so-called cathodic spark evaporation and the so-called cathode atomization (or MSIP—magnetron sputter ion plating) have been established processes for quite some time, which are used for coating tools and components and by means of which the most different layers can be deposited.

For example, there are designs where the material areas formed by a PVD method have a layer thickness of between 10 and 30 μm.

There are also designs where one material area is formed as a layer on the basis of Mo, MoN, MoCuN, DLC or ta-C and one material area is formed as a layer on the basis of chromium oxide or aluminum chromium oxide.

Mo, MoN, MoCuN are resistant layers which improve the tribological properties.

DLC (diamond like carbon) layers generally comprise so-called thin-film systems, which essentially consist of carbon and are applied using PVD or CVD (chemical vapor deposition) methods. These layers are graphitic, diamond-like or amorphous carbon or carbon hydrogen layers as well as plasma polymer layers.

Layers on the basis of ta-C are also so-called DLC layers and distinguish themselves by a certain ratio between graphitically bonded carbon and diamond-like bonded carbon, in which the diamond-like bonded portion predominates. Such layers on the basis of ta-C also offer excellent tribological properties, in particular also in tribological combination with layers on the basis of chromium oxide or aluminum chromium oxide.

There are designs where at least one of the layers has a universal hardness of at least 80 GPa. The hardness of a layer is often an indication of the wear resistance.

The invention concerns in particular an internal combustion engine with an tribological system according to the invention. The above explained tribological systems are particularly advantageous in the thermally highly stressed components with sliding friction loads in the cylinder/piston area. These systems include the tribological system between piston ring 8/9 (rings) and cylinder slide way as well as the tribological system which is formed of the piston shaft slide way (also piston skirt slide way) and the cylinder slide way.

There are designs where the piston is provided with at least one further surface area which is formed as a layer on the basis of chromium oxide or aluminum chromium oxide. These areas include in particular the piston ring groove areas, the piston crown or also the piston shaft. Here, thermally resistant and robust hard layers are helpful to transfer the high stresses in these areas into the base material.

Returning to FIG. 1, this figure illustrates, in a schematic longitudinal sectional diagram, components of an internal combustion engine 100 with a cylinder 101, in which a piston 102 is arranged, which oscillates in operation and which is provided with three piston rings 103 that are arranged in piston ring grooves 104. The cylinder wall 105 has a cooling channel 106, and the actual cylinder bore is formed here by an inserted (optional) cylinder liner 107, on the inner surface 108 of which the cylinder running surface is formed.

The piston 102 has at its upper end the piston crown 109 on which a cylinder-shaped piston ring groove area 110 borders that merges into the piston connector 111.

The cylinder 101 or cylinder sleeve 107 (if present), on the one hand, and the piston rings 103 or the piston connector 111, on the other hand, form here the tribological systems 1 and 2.

Figure 1A:
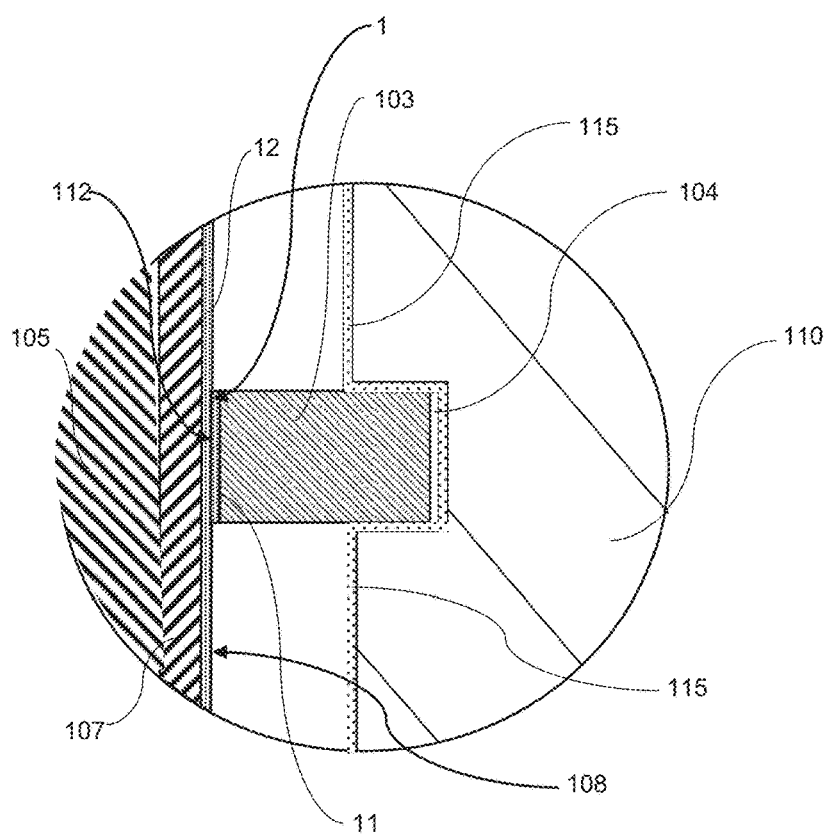
FIG. 1A shows an enlarged section A of FIG. 1, which illustrates a first tribological system according to the invention, said system being formed of a cylinder and a piston ring.

FIG. 1A shows a tribological system 1, in which the piston ring 103 forms a first body, on the surface of which, at least in the area of the ring running surface 112, a first material area 11 is formed as a layer on the basis of aluminum chromium oxide, e.g. as an (Al1-0.7 Cr-0.3)2O3 layer. As regards other compositions according to the invention, the following may apply (Al1-xCr-y)2O3, wherein: $0.1 \leq x \leq 1$ and $y \leq 0.5$; $0.5 \leq x \leq 1$ and $y \leq 0.5$. The layer thickness is between 10 and 30 µm and has a hardness of at least 18 GPa. The layer has a surface roughness (Ra in µm) of Ra=0.15 or Ra=0.4 and is in other embodiments within a range wherein: $0.1 < Ra < 0.5$. Other suitable coatings for the piston rings 103 are designated in table 1b as C2 and D2.

A second material area 12 is formed as a layer on the cylinder slide way 108, said layer being formed from an alumina and chromium oxide mixture and having a weight content of 62 wt % $Al_2O_3$ and a weight content of 38 wt % $Cr_2O_3$. The surface roughness is Ra=0.45 µm (E1 in Table 1a). Alternatively, the first material area is formed as a chromium oxide ($Cr_2O_3$) layer which has a surface roughness of Ra=0.15 µm (D1 in Table 1a).

Alternatively, the second material area 12 is formed from an aluminum chromium oxide layer in which the chromium oxide content constitutes a wt % content of 10 to 100 and the aluminum oxide content forms a corresponding complementary wt % content of 90 to 0. Other suitable coatings for the second material area can also be the layer systems designated A1, B1 and C1 in Table 1a.

The piston ring or rings 103 (first body) and the cylinder 105 or the cylinder sleeve 107 (second body) thus form a tribological system with the contacting surfaces 112 and 108 and the first material area or areas 11 and the second material area 12, respectively, in which the contacting surfaces glide against each other during operation.

There are operating conditions in which there is a largely dry friction, namely at the upper and lower dead center of the piston, at which the piston speed is low or even zero. The lubricating film between the two surfaces formed by the engine oil then largely breaks off.

Wet or lubricated friction occurs during the oscillating movement of the piston between the reversal points. The engine oil then forms an effective lubricating film between the material areas 11 and 12, which greatly reduces friction and wear.

Mixed friction conditions can also occur in which lubricants are not present as a complete film between the material areas 11 and 12 but are available in depressions in the surface. This lubrication effect can be stronger with higher surface roughness (e.g. on honed surfaces) than with smoother surfaces with lower surface roughness (e.g. polished or brushed surfaces), which have a lower lubricant absorption capacity.

Figure 1B:
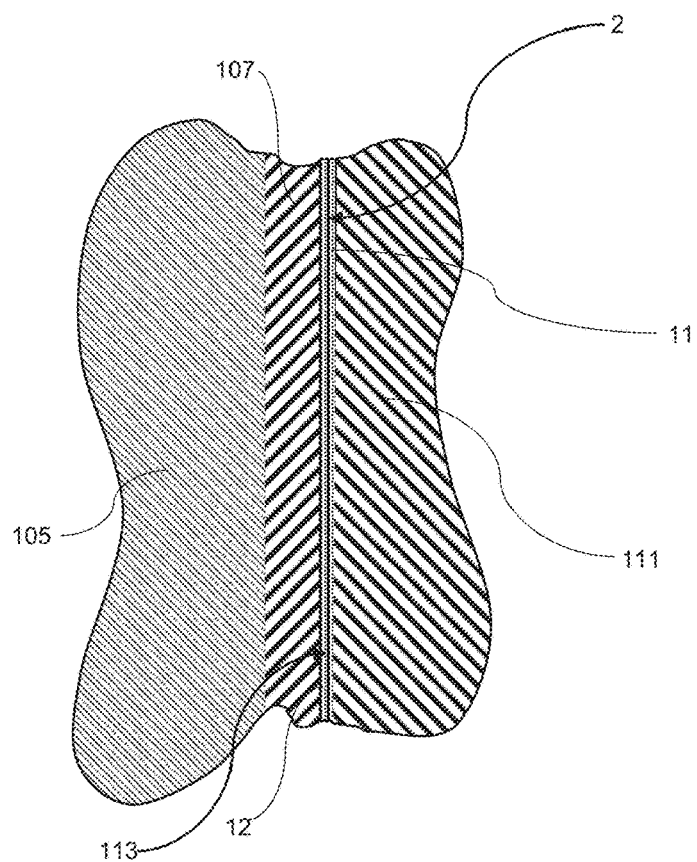
FIG. 1B shows an enlarged section B of FIG. 1, which illustrates a second tribological system according to the invention, said system being formed of a cylinder and a piston.

A second tribological system 2 is shown in FIG. 1B. The detailed illustration 1B shows the piston connector 111 on the surface 113 of which a first material area 11 is formed, which is provided with a coating, which are designated in Table 1a as A1, B1, C1, D1 or E1. Alternatively, the surface 113 can also have a different coating, which is described above in connection with the coating of the cylinder slide way 108. Here too, similar to the first tribological system 1, dry, lubricated or mixed friction occurs during operation, which depends on the state of movement of the piston 102 in the cylinder 105.

Figure 1C:
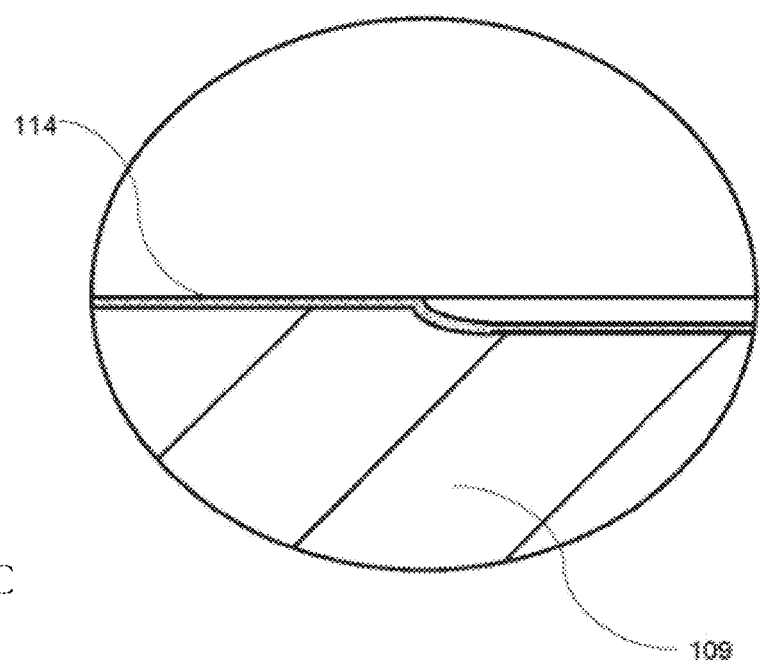
FIG. 1C shows a detail C of FIG. 1, which illustrates a cylinder bottom with a coating.

Further optional coatings can also be provided in other surface areas of the piston; on the one hand, at the piston crown (see FIG. 1C), which can be provided with a layer 114 to improve the thermal and pressure resistance. Another layer 115 can also be provided in the piston ring groove area 110, in particular in the area of the piston ring grooves 104. The layers A1, B1, C1, D1, E1, listed in Table 1a, and also layers on the basis of molybdenum, molybdenum nitrogen, molybdenum copper nitrogen, DLC or ta-C can be used here.

Furthermore, it also applies that, for example, if the piston rings 103 are provided with a layer on the basis of chromium oxide or aluminum chromium oxide (in the first material area 11), the layer cooperating therewith (second material area 12) can be formed as a layer on the basis of Mo, MoN, MoCuN, DLC or ta-C on the cylinder slide way 108.

Conversely, in the case where the piston ring or rings 103 are provided with such a layer, the cylinder slide way 108 is then provided with a layer on the basis of chromium oxide or aluminum chromium oxide, in particular with a layer, the properties of which are described in derail above or below.

The same applies to the tribological system formed by the cylinder slide way 111 with the piston shaft slide way 113.

In the following, FIGS. 2 to 16 are used to describe a test with the associated test setup and some test results, which have led, among other things, to the above described embodiments according to the invention.

An important test of this kind is the vibration-friction-wear (SRV) test (DIN 51834), with which the wear and friction behavior of materials can be characterized. With these tests it is possible to simulate many tribological situations of the later application, so that a useful preselection of the coatings of body and counter-body can be made. It is thus possible to use in the real combustion engine a mostly already somewhat optimized solution when selecting the coatings, so that then only fine adjustments are necessary. This is achieved by adjusting the parameters of the SRV test, such as contact pressure or temperature, in such a way that the result of the test reflects the results of engine tests already performed.

Such an SRV test was used for the investigations according to the invention, and the parameters for the test were selected in such a way that deficient lubrication in the tribological contact was simulated. The parameters were used both in the case of deficient lubrication and in the case where the test was carried out "dry", i.e. without lubricant. Experience has shown that such a test provides information about two basic wear behaviors. The dry test investigates above all the seizure behavior of the partners in tribological contact and the relative wear of the tribo-partners becomes clear. The lubricated tests under this high contact pressure simulate insufficient lubrication. These test conditions provide information on the wear of the tribo-partners and also provide coefficients of friction that allow relative comparisons of the material combinations.

Various layer materials were investigated in the experiments. The selection of the layers was carried out with a view to further developing and improving the tribological contact between piston ring and cylinder slide way of an internal combustion engine, i.e. the layers were produced in a first group 1 using a thermal spraying method and in a second group 2 using a PVD method, preferably by sputtering and more preferably by reactive cathodic spark evaporation.

The two coating methods were used to coat the test specimens, namely the sample specimens of group 1 were provided with layers which, as experience has shown, are well suited for application to cylinder slide ways or which were to be examined for this application.

Group 2 specimens were coated with materials which, as experience has shown, are suitable for piston ring coatings or the properties of which should be clarified for such an application. The layers were deposited on planar test specimens and partially after-treated. The test was carried out with both steel counter-bodies (100Cr6) and aluminum oxide.

Figure 2:
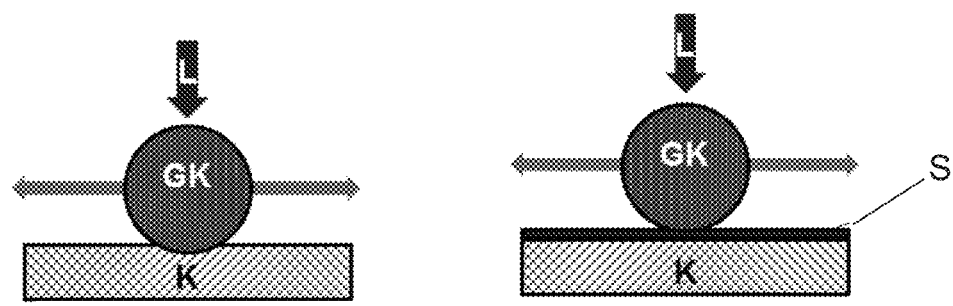
FIG. 2 shows a schematic diagram of an SRV test setup for a dry test (left-hand illustration) and a lubricated test (right-hand illustration) for a tribological test for determining a coating suitable for a tribological system according to the invention.

FIG. 2 shows the schematic setup of the apparatus which was used for carrying out the SRV tests and describes the terms used in the text. The tests were carried out for a far greater number of layer materials, but not all of them are discussed here.

Two important technical goals aimed at in the development in the field of internal combustion engines are to reduce wear in order to prolong the service lives of the components and the service interval times as well as to reduce friction losses in order to improve the efficiency.

An important aspect also concerns the temperature stability of the materials used in the internal combustion engine. The trend here is to improve the temperature stability so that the combustion process can take place at higher temperatures in order to thereby also increase the efficiency of the engine. The search for temperature-stable layer materials that protect the compact material surface at these higher temperatures and have good tribological properties at both ambient temperature and high temperatures was another important reason for these investigations.

FIG. 2 describes the principle of the SRV test under dry (on the left) and lubricated (on the right) conditions. The tribological system or tribo-system consists of two tribo-partners—the body (K) and the counter-body (GK). While the K is coated with a layer, the experiments used spherical polished GK made of steel (100Cr6) and aluminum oxide. K is firmly clamped in a base and can be heated. GK is moved in an oscillating manner with horizontal oscillations above K by the forces indicated by the two arrows over the coated surface of K while a load L is simultaneously applied. In the lubricated test (on the right), a lubricant S is added to this oscillation.

Description of the Experiments

Tables 1a and b show the layer materials that have been tested. Some of these materials have already been technically introduced or have already qualified for engine tests (A1, B1, C1).

In addition, further materials were tested, the tribological properties of which were unknown but which promised improved temperature stability (D1, E1, C2, D2). These materials are mainly of oxidic origin and some of them belong to the content of the invention. Tables 1a and b list only some of the materials tested and also indicate the surface roughness which these layers had. It depends, of course, on the different after-treatments.

These investigations only used common methods for these after-treatments, such as honing, grinding or brushing, so that a technical implementation of the invention is ensured not only for the coating but also for the after-treatment. The table groups the layer materials according to the coating methods, i.e. the layers for which the application to the cylinder running surface is intended are given in Table 1a, those intended for the coating of the piston rings are given in Table 1b. This separation was made because the different coating methods are suitable for the coating of ring and liner to different degrees, but it should not be regarded as a restriction.

Furthermore, it is not mandatory that layer materials with the same chemical composition, which were produced in the different coating methods, also have the same properties in the tribological system. This can be due, for example, to different layer thicknesses or the mechanical properties of the layers with regard to their porosity or residual stress. Thermal spraying methods were used for the layers on the cylinder running surfaces, and coatings with thicknesses between 150 μm and 800 μm were produced. For the coating of the piston ring materials a PVD method was used, which was the reactive cathodic spark evaporation for the layers selected in this case, although other coating methods, such as thermal evaporation or sputtering, can also be used for this purpose.

Flat samples were coated. All samples produced by thermal spraying were after-treated in such a way that they had a surface roughness corresponding to the standard honing which is used in production for the after-treatment of the thermally sprayed cylinder slide ways.

The layers produced by means of spark evaporation were either not after-treated or were after-treated using a standard brushing method. The assignment to the manufacturing process, a selection and more detailed description of the layer materials as well as the type of after-treatment and the resulting surface roughness are also given in Tables 1a and b.

Polished steel (100Cr6) and aluminum oxide balls were used as counter-bodies in the SRV tests. The tests were carried out both dry and lubricated with two different oils. The test was carried out at ambient temperature and for temperatures up to 160° C., close to the stability limit of the lubricant used, in order to also investigate the stability of the layers at higher temperatures.

The tests yielded the following results:
1. The curve of the coefficient of friction as a function of time
2. The wear of the coating under the various conditions
3. The wear of the counter-body under the various conditions The results are given in tabular form. For the coefficient of friction, the value resulting at the end of each test is incorporated into the table. The evaluation of the wear of coating and counter-body is based on the optical assessment of light microscopic wear images and the quantitative evaluation of optically scanned surface profiles. For a better understanding of the values given in tabular form, an example is given for all types of results and the conditions examined in the SRV test.

Figure 3:
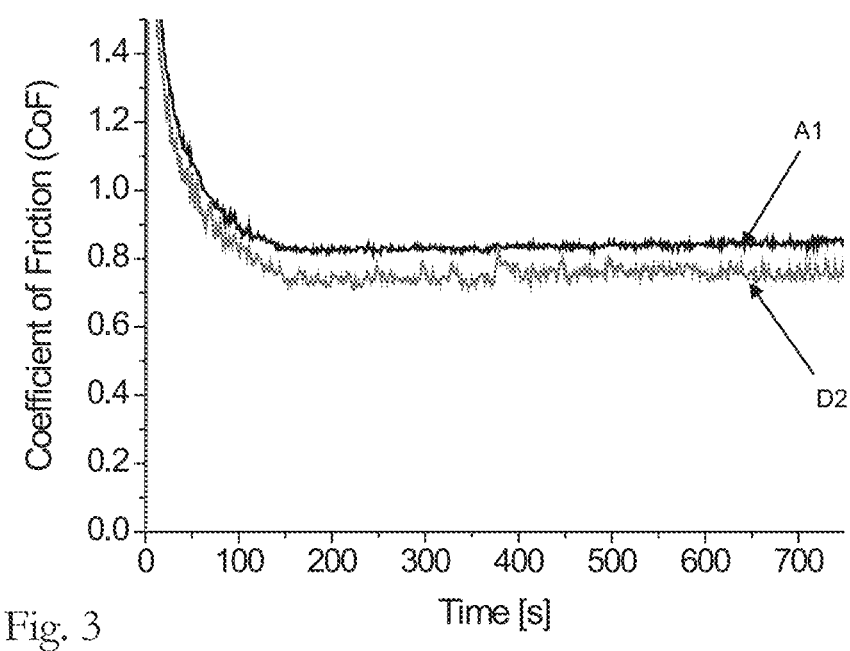
FIG. 3 shows the time course of the coefficients of friction for a reference material A1 and an Al—CrO material D2 with a counter-body from a steel material.

FIG. 3 shows the time course of the coefficient of friction for the layer of the after-treated low-alloy steel (A1) and the polished Al—Cr—O layer (D2) with the polished steel ball as a counter-body. The SRV test was carried out dry, i.e. without lubrication. It can be seen that the coefficient of friction at the end of the measurement time is 0.86 for A1 and 0.76 for D2. The noise of curve D2 is higher with the oxide layer than with the low-alloy iron.

Under these test conditions, the tribological system has values for the coefficient of friction that indicate to a person skilled in the art a "seizure" in the tribological contact. Such values must be avoided for the applications discussed here.

Figure 4:
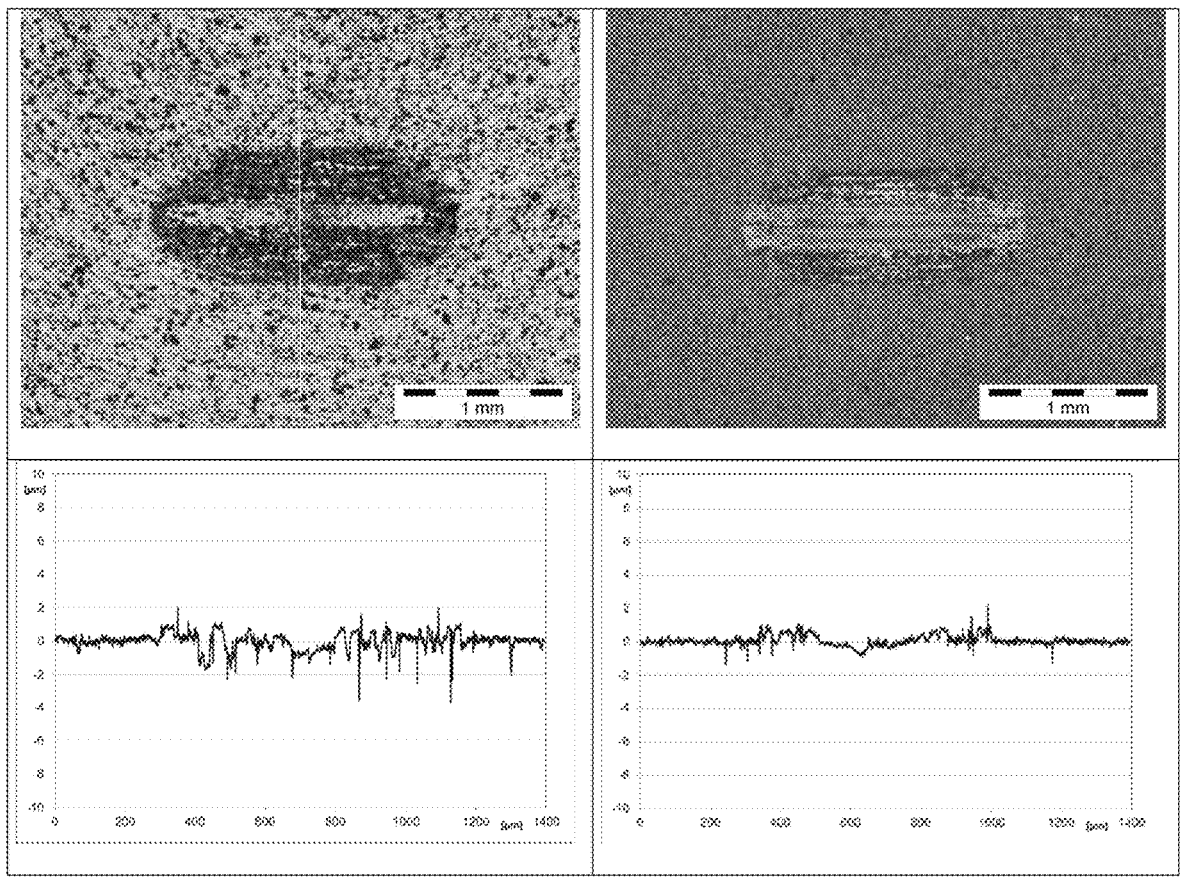
FIG. 4 shows the observed and measured wear of the materials from FIG. 3.

FIG. 4 shows the wear of the layer. For this purpose, light microscopic images of the layer surface were taken after the test (upper row of images). A clear change in the layer surface can be seen in the area in which the oscillating steel ball has moved and which is about 1 mm long. EDX measurements can be used to detect the material of the counter-body (100Cr6) on both A1 and D2, i.e. material was transferred from the counter-body to the layer (seizure), indicating wear of the counter-body.

To characterize the layer wear in more derail, the surface was mechanically scanned perpendicular to the oscillating direction of movement, as indicated by the white line in the illustration. A confocal white light microscope of type "µ-Surf" of the manufacturer Nanofocus was used as the device for this measurement. The surface profile for A1 obtained in the scanning shows an increase in the surface roughness with partial material application and partial layer wear of A1. Less wear can be observed in the surface profile of D2: Application at the edges of the oscillating movement and almost no abrasion in the middle, except for a scratch. On the scale of wear (1—no wear, 5—strong wear), this wear would be evaluated with about 2 for A1 and 1-2 for D2.

The size of the coefficient of friction can also be explained to a person skilled in the tribological field. The values around 0.8 are typical for a dry friction of steel on steel, which in this case is realized by transferring the material to the layer. Further wear values are given in the table 2. In the values for B1 and C2, a minus sign was placed after the wear value, which is supposed to indicate that a very strong material transfer of the counter-body took place in these two layers, i.e. there was no wear but a layer build-up with the counter-body material. The values in the table indicate that, with the exception of C1, the layers are highly wear resistant to steel. However, they indicate that dry conditions must be avoided for the discussed layers if, in the tribological system, a steel wear-resistant layer is combined with steel as the counter-body. Under these conditions, even improved surface roughness can apparently not prevent the counter-body material against seizure.

Figure 5:
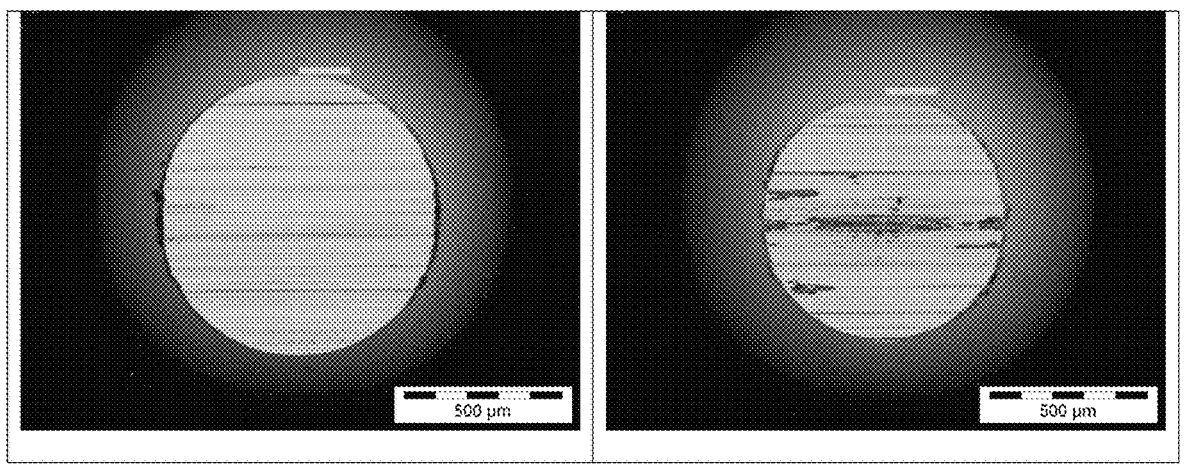
FIG. 5 shows the wear of the counter-body in the SRV test with the layers illustrated in FIGS. 3 and 4.
Figure 6:
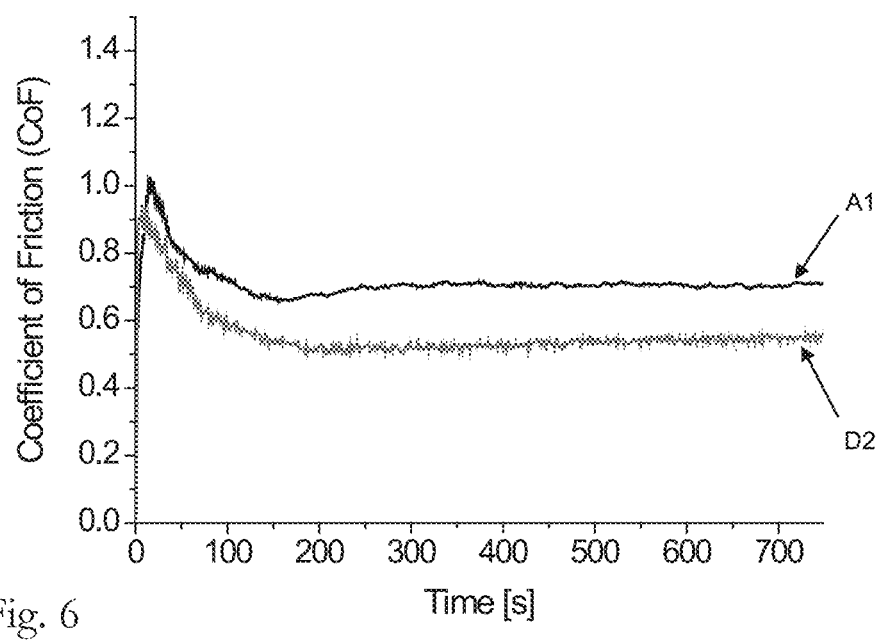
FIG. 6 shows the time course of the coefficients of friction of the materials A1 and D2 illustrated in FIGS. 3-5 with a counter-body made of aluminum oxide.

In addition to the wear of the coated body, in a tribological system the wear of the counter body is, of course, also important when it comes to optimizing the wear behavior of the tribo-system. FIG. 5 therefore examines the wear of the counter-body, in this case, the polished 100Cr6 steel ball by taking light microscopic images of the ball area that was in contact with the layer. The diameter of the so-called wear cap is a measure of wear and the wear volume can still be calculated therefrom. For the tabular evaluation, a scale from 1 to 5 is used here again, wherein 1 again means no wear and 5 means very high wear. Regarding the photos in FIG. 5 A1 is assessed with 4 and D2 with 3.

Figure 7:
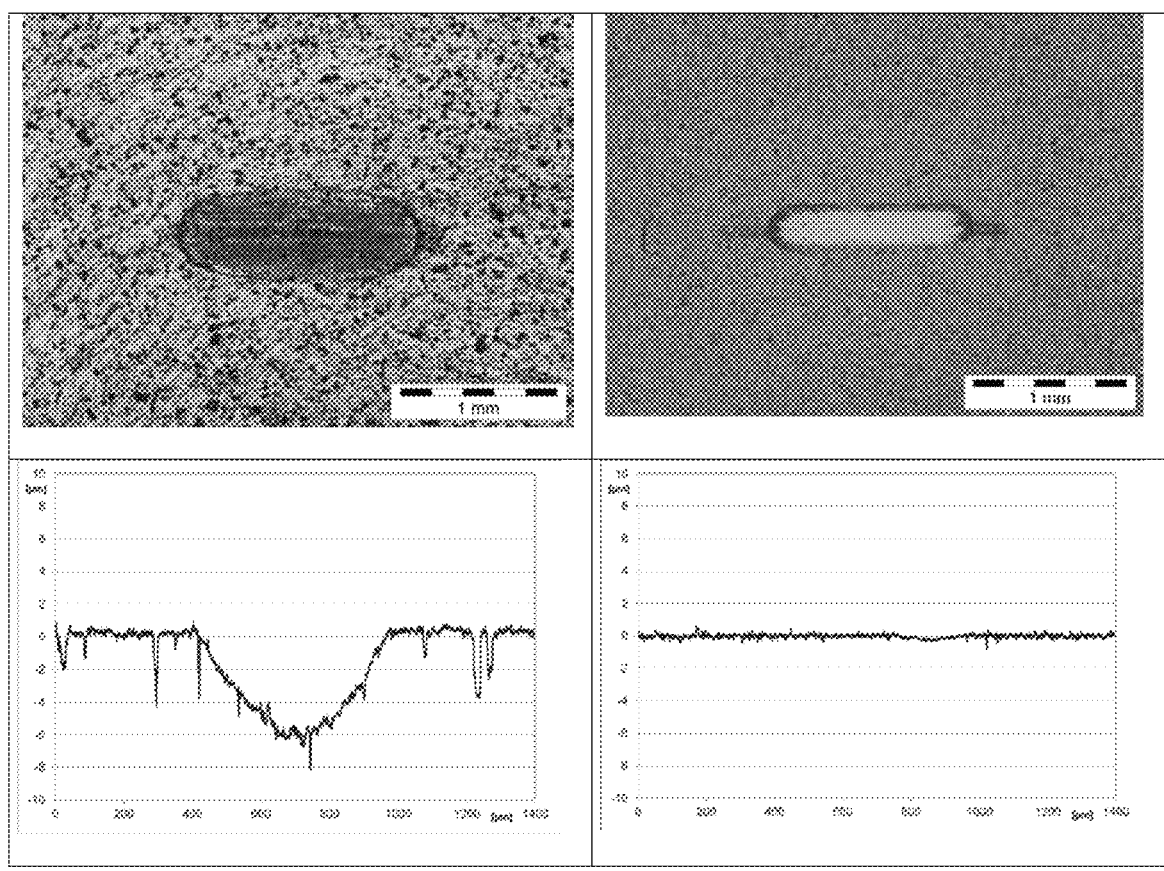
FIG. 7 shows the observed and measured wear of layers A1 and D2 with the counter-body according to FIG. 6.

What also stands out is the lower noise over time in the coefficient of friction for D2. The examination of the layer wear using light microscopic images and surface profiles in the wear area gives different results for the two layers (FIG. 7). A clear layer wear is observed in connection with A1, which is estimated to be 4. Amazingly enough, no layer wear can be found with D2, there is only a kind of smoothing of the contact area. Based on this, the layer wear is evaluated with 1.

Figure 8:
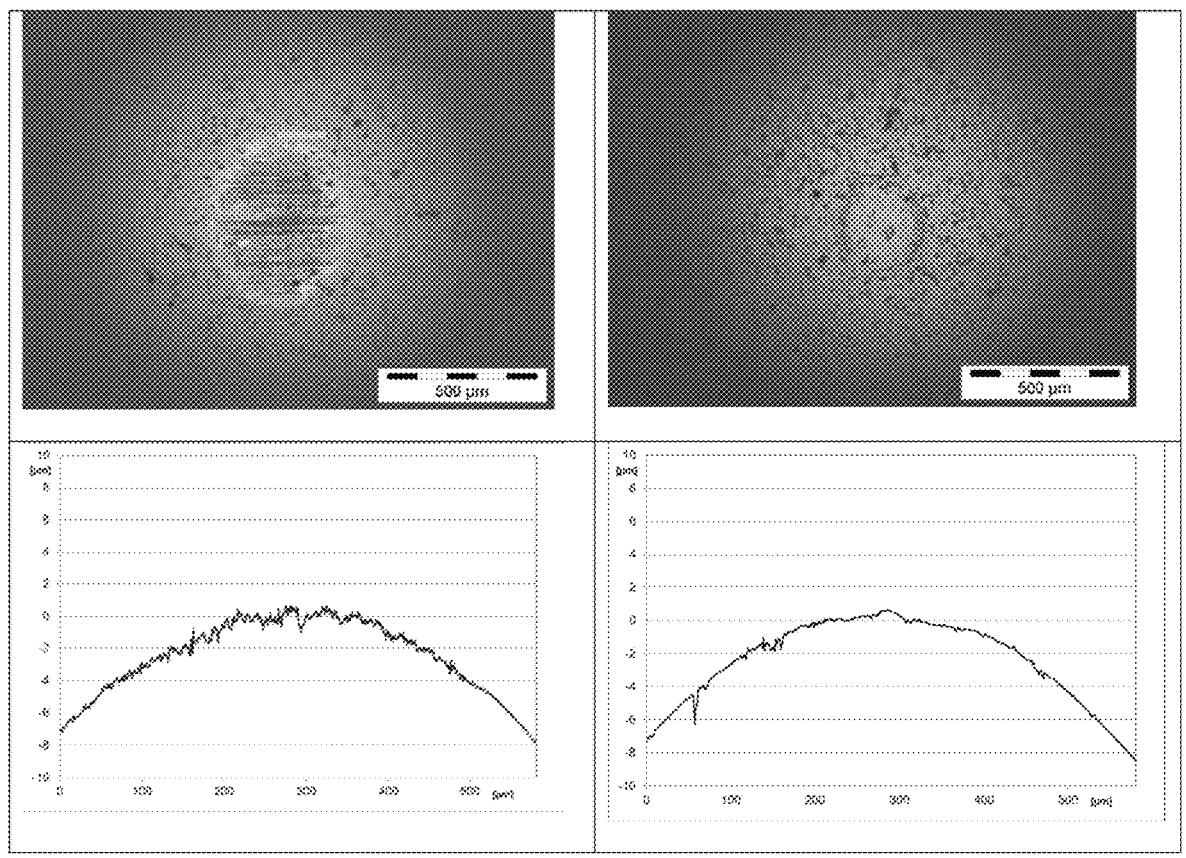
FIG. 8 shows the wear of the counter-body after the SRV rest under dry conditions in contact with the coatings A1 and D2.

The wear of the aluminum oxide counter-body is shown in FIG. 8. The wear of the counter-body is clearly smaller for both layer systems than is the case with the 100Cr6 counter-body. For A1 (top left), the counter-body shows a contact surface which has many scratches. Subsequent measurements of the rounding of the counter-body (bottom left) confirm a roughening of the surface of the aluminum oxide counter-body, although otherwise no significant change in the ball radius could be observed. It can be assumed that this material pairing generates breakouts which lead to such a rougher surface. The background to these outbreaks has not yet been unequivocally clarified. No wear of the counter-body is observed for D2 (right-hand column). This is an amazing result for a tribological system without lubrication, which is operated under high contact pressure. The circle area in the photos with modified surface quality for A1 and D2 indicates the area of deformation when the test proceeds under the selected conditions and characterizes only the deformation in the region of the contact area of body and counter-body, which is typical for the respective material pairing. This deformation is therefore not necessarily a wear cap as was the case for the 100Cr6 ball. The proof of this is once again delivered by the scanning of the surface with the nanofocus, which gives the original radius and shows no flattening of the ball. The outstanding results for the dry SRV test are therefore provided by the bodies and counter-bodies in which layer pairings of layers on the basis of chromium oxide and aluminum chromium oxide are available.

The results of the SRV test with lubricant are presented below. The tests were carried out with various lubricants which led to different coefficients of friction. In terms of wear, however, these differences are less or not differentiable. Usually only a different coloring of the contact area is visible. Examinations showed that this is mainly due to the different additives in the oil. Since the treatment of the additives is not the subject of this invention, these differences are not dealt with in more detail.

Figure 9:
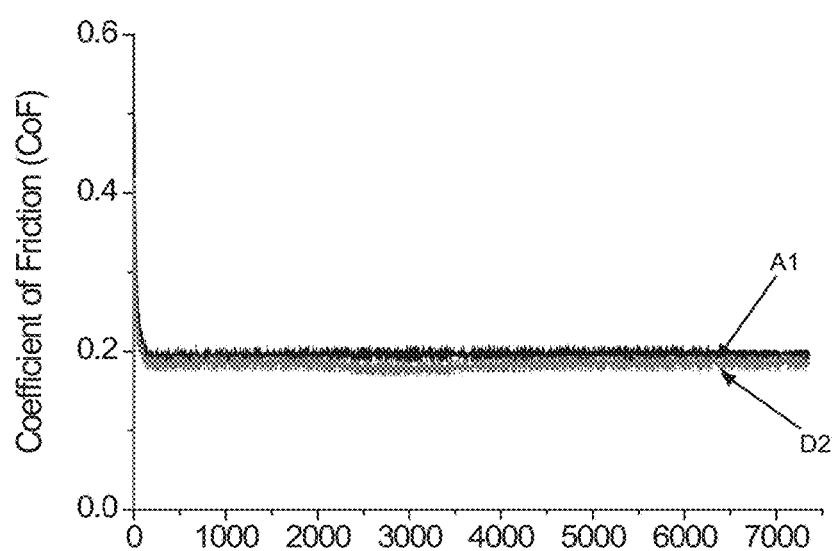
FIG. 9 shows the time course of the coefficient of friction of A1 and D2 with a steel ball as a counter-body under lubricated test conditions with a first lubricant.

FIG. 9 shows the coefficient of friction over time for A1 (1) and D2 (2), which was measured with diesel oil as lubricant (here referred to as oil1) and the steel ball as counter-body. A1 has a coefficient of friction of 0.20 in run-in operation, while that of D2 is 0.18. The relative differences in the coefficients of friction in a comparison with the dry test have become smaller, i.e. the material influence under lubricated conditions is less pronounced. The surface quality of the coating also has a greater influence, i.e. that the hole or pore structure of a surface—as present in A1 as a result of the thermal spraying process—is more suitable to keep the lubricant in the surface and thus makes the tribological system safer, especially in the case of insufficient lubrication. In outlines, this can also be seen when comparing C2 and D2 because the unpolished layer C2 has a lower coefficient of friction than the polished one.

Table 3 shows all coefficients of friction for the lubricated SRV test together with the steel as the counter-body.

Figure 10:
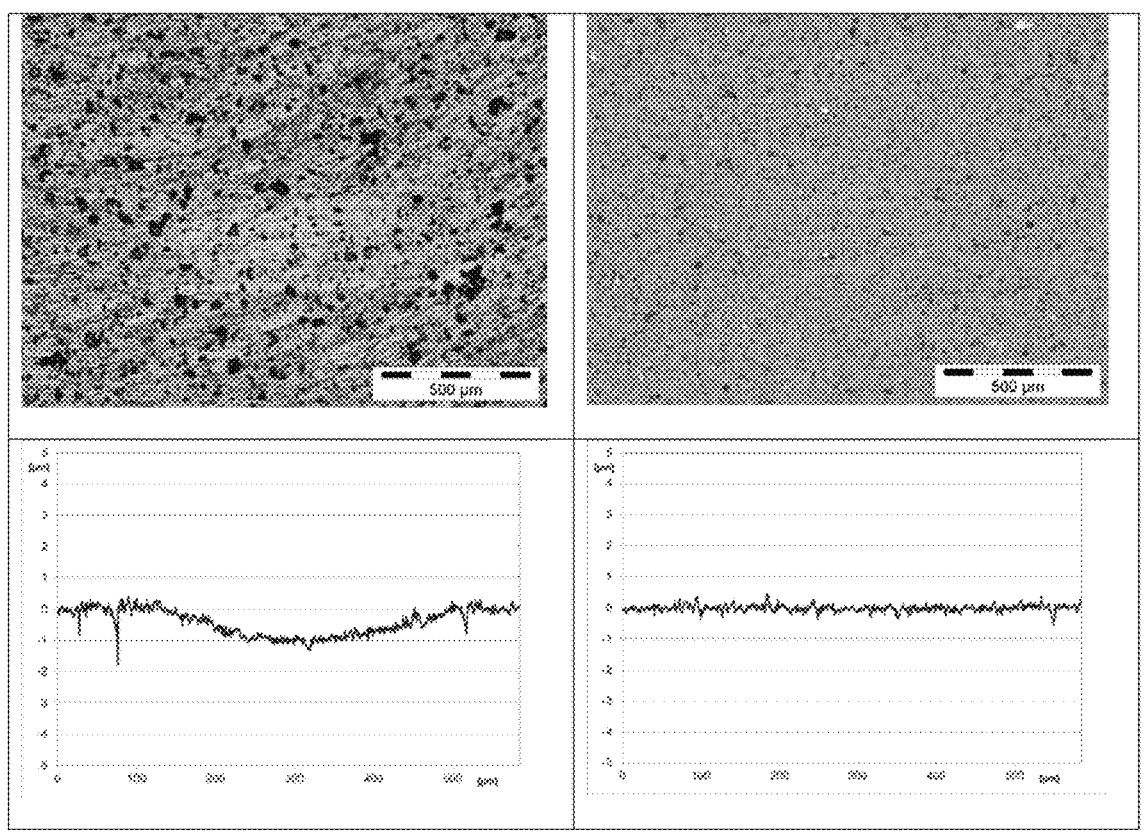
FIG. 10 shows the wear of the layers A1 and D2 after the SRV test under lubricated conditions according to FIG. 9.

The layer wear obtained under these test conditions is shown in FIG. 10. A1 shows low layer wear with a value of 2 and otherwise only a smoothing effect in the contact area. No layer wear (value 1) can be measured for D2. Here, too, smoothing could take place although it is not clearly demonstrated in the measured surface profile. The other values for layer wear are again given in table 3. Low wear can only be measured for layers A1, B1 and C1 while all layers on the basis of chromium oxide and aluminum chromium oxide show no wear.

Figure 11:
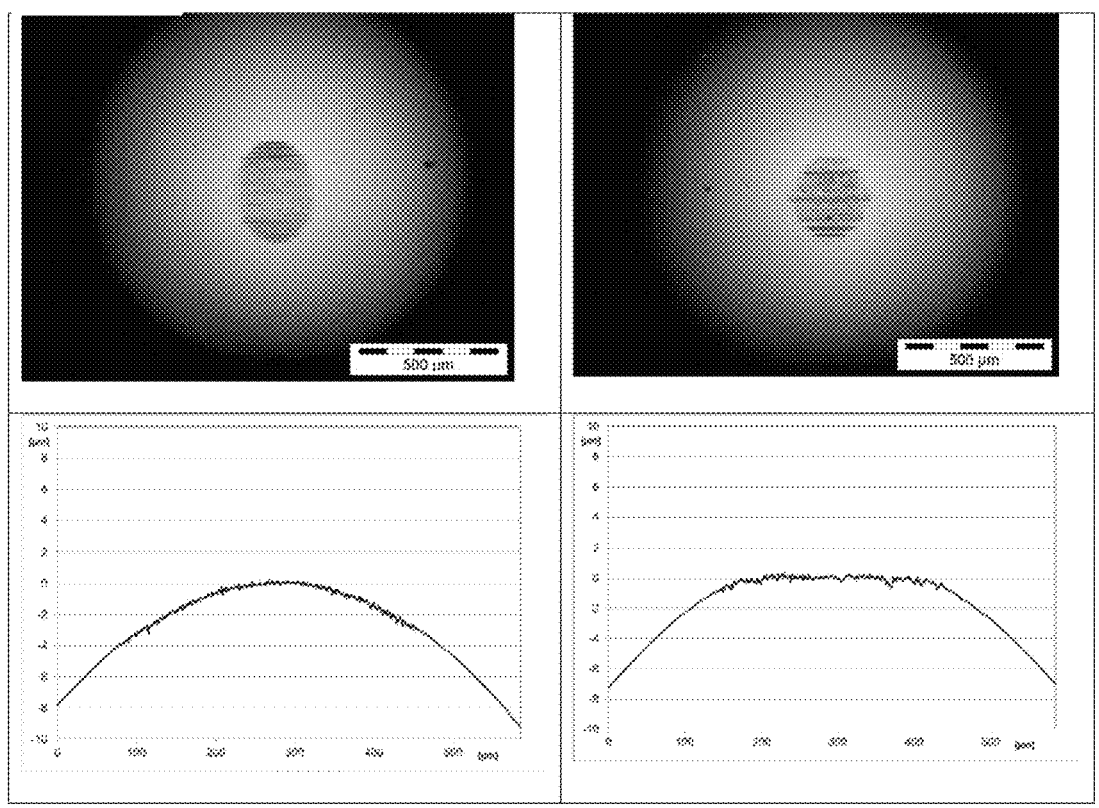
FIG. 11 shows the wear of the steel counter-body after the SRV test illustrated in FIGS. 9 and 10.
Figure 12:
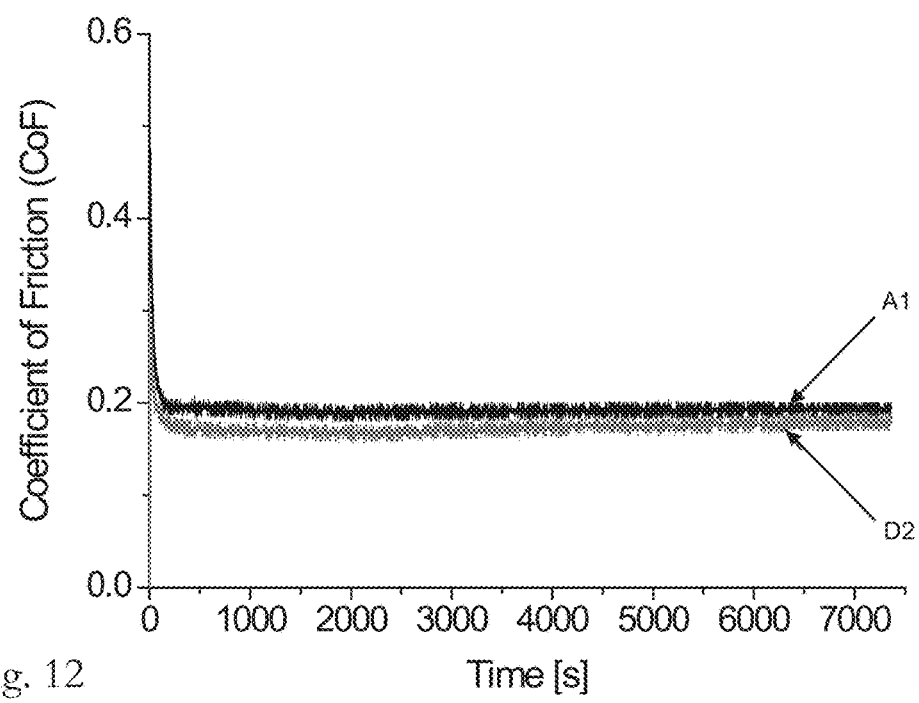
FIG. 12 shows the time course of the coefficient of friction of A1 and D2 with an aluminum oxide ball as a counter-body under lubricated test conditions with a first lubricant.

The wear of the steel counter-body with the lubricant oil1 is shown in FIG. 11. Surface discolorations can be seen for both configurations. The surface profile of the 100Cr6 ball in the case of A1 shows little wear (value 1-2), i.e. the surface discoloration is caused by an elastic deformation of the contact surface alone and the discoloration is caused by a thin film which mainly resulted from the additives in the oil or the decomposition products thereof. For D2, the size of the contact surface discoloration is similar to that of A1, but the surface profile of the 100Cr6 ball shows low wear with the value 2. The steel body is subject to more pronounced wear by the layers E1 and C2. All layers on the basis of chromium oxide and aluminum chromium oxide show a very high microhardness of over 20 GPa (measured according to the ISO 14577 standard), and it is important that the surface quality is chosen accordingly if these layers are to be used with steel as a counter-body.

The result of the SRV test with the aluminum oxide counter-body is of great interest because no wear could already be determined under dry conditions on the two tribo-partners for D2. FIG. 10 again shows the time course of the coefficient of friction, for which a value of 0.19 results for A1 and of 0.18 for D2 at the end of the test. Here, too, the relative influence of the coating material on the coefficient of friction is lower than in the dry test. Obviously the formation of a surface, which results from the interaction of material surface, oil and additives and which manifests itself in the discoloration, plays an important role. B1 has the highest coefficient of friction. Otherwise, a coefficient of friction of 0.18 was measured for all other materials. In these tests, the coefficient of friction is surprisingly lower than in the case of A1 and C1 layers already introduced against steel.

Figure 13:
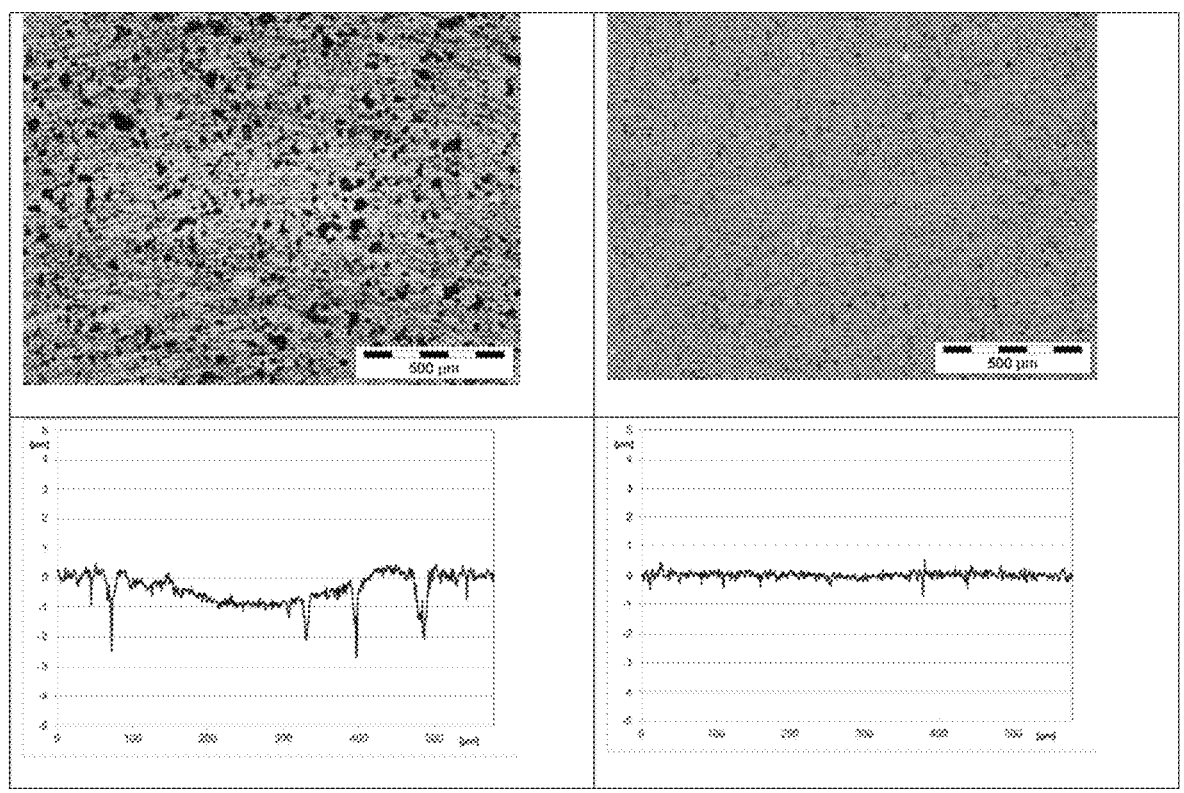
FIG. 13 shows the wear of the layers A1 and D2 after the SRV test under lubricated conditions according to FIGS. 11 and 12.

FIG. 13 shows the layer wear, which is very low for A1 (value 2) and rather only indicates a smoothing effect. This is a good behavior, especially against the background that the layer contains many pores. This in turn indicates that such a surface geometry contributes to better tribological properties, i.e. that lubricants are retained in the layer recesses and reduce friction losses. No layer wear can be measured for D2 (value 1). The layer is stable, although a certain smoothing effect is also suspected here. High wear show B1 (value 5) and also C1 (value 4). In particular layer B1 shows how important it is to coordinate body and counter-body, because B1 provides the lowest coefficient of friction against steel and the highest against aluminum oxide.

Figure 14:
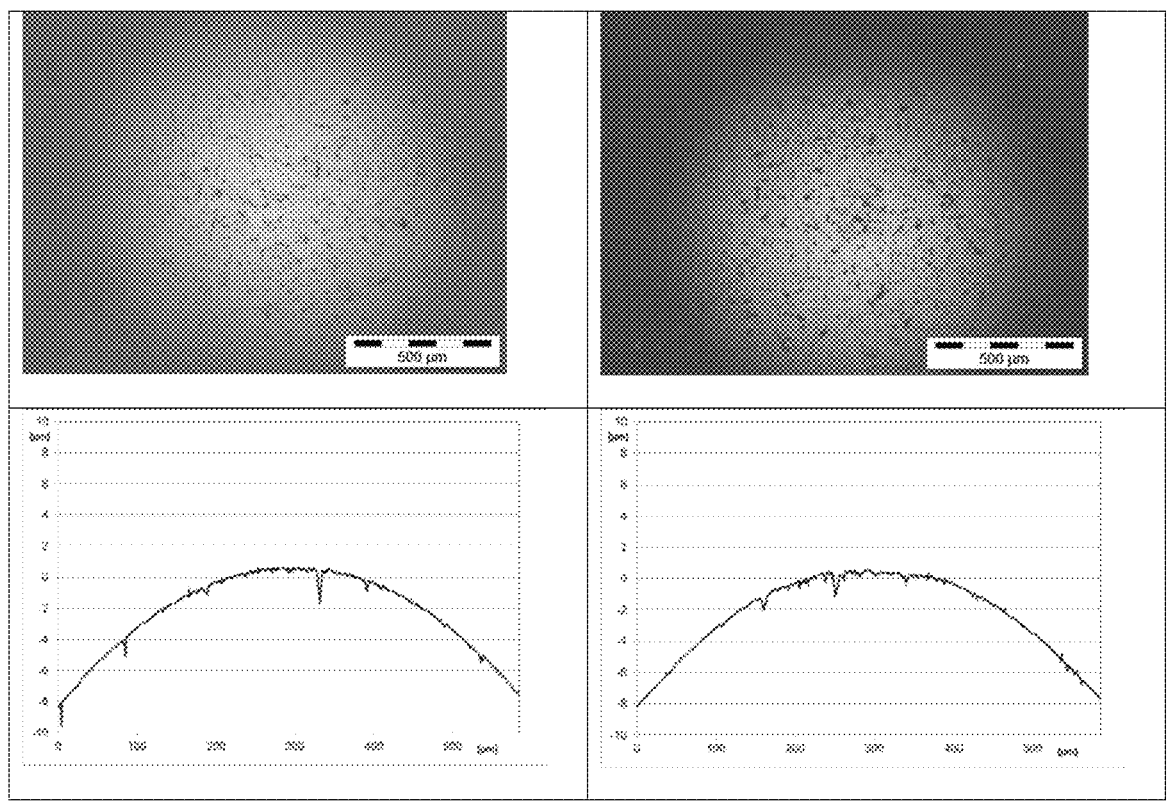
FIG. 14 shows the wear of the counter-body after the SRV test under lubricated conditions according to FIGS. 11-13.

FIG. 14 characterizes the wear of the aluminum oxide counter-body. Neither A1 nor D2 show any wear of the ball (both values 1). The roughness in the surface area, which is measured in the surface profile, is characteristic for the given porosity of the material. The scratches are caused by small eruptions of the material, which during the test occur between the surfaces of the layer and the counter-body and, in contrast to real engine tests, are not transported away with the oil during our test setup.

Tables 2 and 3 summarize the results for the layer materials tested with respect to the two counter-body materials for the different test conditions. The qualitative estimates were derived from the measurements, as exemplified in the previous text. On the basis of these investigations, the results of the SRV test so far can be summarized as follows:

SRV: dry with 100Cr6 as counter-body
  For all tests there is considerable wear of the 100Cr6 steel counter-body
  The tests stabilize at coefficients of friction in the range around 0.8. This is due to the fact that material of the counter-body is lubricated (transferred) to the respective layer, thus creating a steel-steel contact. Accordingly, a clear and high wear of the counter-body is observed for all layers examined here.

SRV: dry with aluminum oxide as counter-body
  The layers A1, B1 and C1 show layer wear, although this wear is lower for the layers selected here compared to other common materials that were not included in the table.
  The oxide layers investigated are divided into two groups. The group with high surface roughness (E1) has a coefficient of friction around 0.8 and shows a strong noise in the time course of the coefficient of friction. The second group (D1, C2, D2) has coefficients of friction around 0.6 and thus stands out clearly from the other layers. The layers of this group have a surface roughness of Ra below 0.4 μm.
  Apart from smoothing effects, all oxide layers based on Cr and Al—Cr (D1, C2, D2) show no layer wear.

SRV: lubricated with 100Cr6 as counter-body
  The coefficients of friction for all the layers examined show values below 0.2, with B1 and D1 being the lowest.
  The layers (A1, B1, C1) which are not based on chromium oxide and aluminum chromium oxide show low wear of value 2.
  No layer wear can be detected on the layers (D1, C2, D2) on the basis of chromium oxide and aluminum chromium oxide.
  With the exception of E1 and C2, i.e. the hard oxidic layers with greater surface roughness, all other layer materials have small counter-body wear values of 1-2 or 2. The surface roughness of the layer under lubricated conditions and with 100Cr6 as counter-body obviously plays an important role, and if such material pairings are to be realized, the running-in behavior must be optimized and the layer roughness Ra must be less than 0.2 μm.

SRV: lubricated with aluminum oxide as counter-body
  The coefficients of friction are all in the range between 0.18 and 0.20 except for B1 (0.21).
  The layer wear is very high in the case of B1, medium in the case of C1 and E1 and low with A1. No layer wear can be observed in the case of layers D1, C2 and D2 which are based on chromium oxide and aluminum chromium oxide.
  The test generates little wear of the counter-body for most layers and no wear for A1, D1 and D2.

Finally, the test was also carried out at higher temperatures. A different, somewhat more temperature-stable oil2 was used for this purpose. The use of this oil did not change anything in principle from the findings of the previous SRV test at room temperature. The oil2 provided slightly different coefficients of friction, but did not give any other qualitative results for the wear behavior of coating and counter-body.

This does not mean that this is also the case for all other oils. The use of another additive alone can lead to drastic changes in the coefficient of friction. However, this was not the content of these investigations and therefore will not be discussed in more detail. The oil2 used for the SRV tests at higher temperatures was stable for tests up to temperatures of 160° C.

Table 4 indicates the tested layers tested at room temperature (RT), 100° C. and 160° C. The table shows only a small selection of the tested layers and concentrates mainly on the layer materials which are the subject of the invention.

Again, as already described above, the time course of the coefficient of friction, the layer wear and the wear of the counter-body were tested for these layers and the counter-bodies. In the following, this procedure shall again be demonstrated using an example, this time without the light microscopic images, and only the surface profiles will be shown. The determination of the coefficients of friction and the qualitative assessment of the layer wear and counter-body wear were carried out analogously to the evaluations already described above.

Figure 15A:
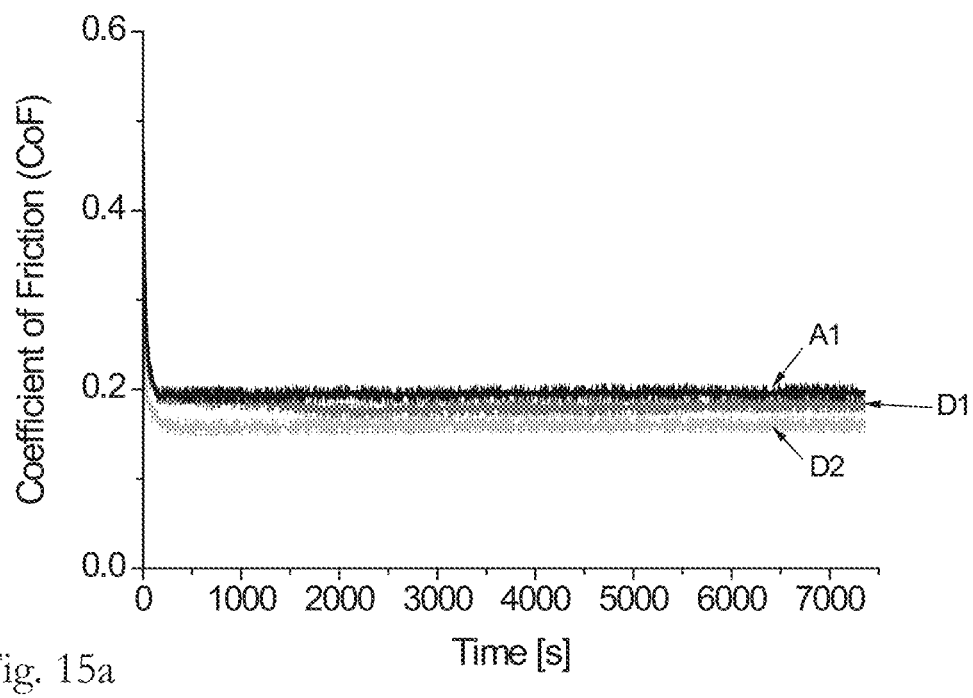
FIGS. 15A to 15C show the time course of the coefficients of friction for the materials A1, D1 and D2 for a lubricated SRV test with an aluminum oxide counter-body at room temperature (FIG. 15A), at 100 degrees Celsius (FIG. 15B) and at 160 degrees Celsius (FIG. 15C)
Figure 15B:
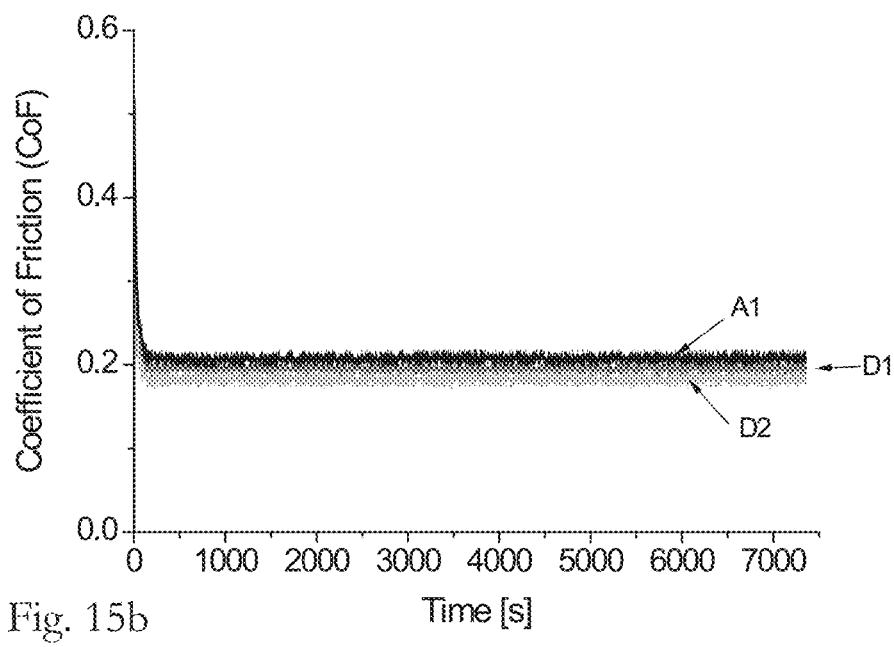
Figure 15C:
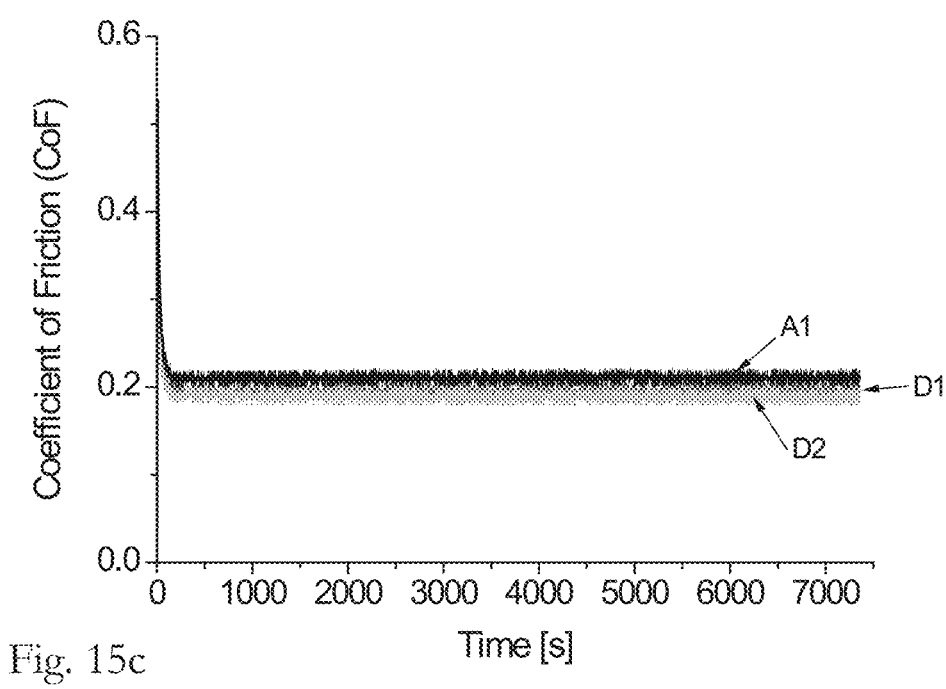

FIGS. 15a to c show the time courses of the coefficient of friction for the coating systems A1, D1 and D2 with the aluminum oxide as counter-body and for the lubricated (oil2) SRV test. A comparison of the different coating materials at room temperature reveals clear differences between A1 and D1 as well as D2. These decrease with higher temperatures, but do not disappear. For all temperatures, layers D1 and D2 have the lowest coefficients of friction.

Figure 16:
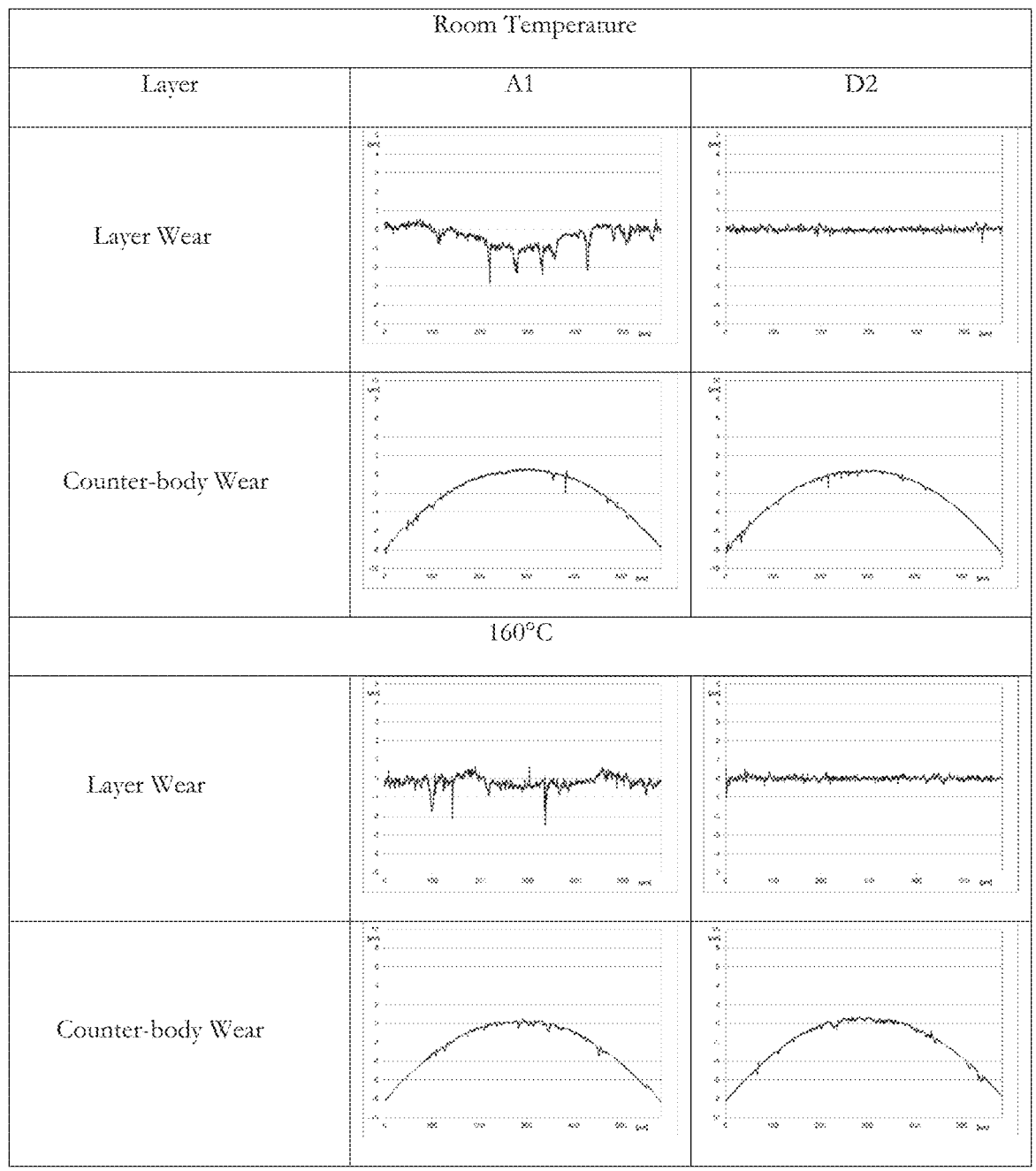
FIG. 16 shows the comparison of the layer wear and counter-body wear for the lubricated SRV test illustrated in FIGS. 15A and 15C for the layer systems A1 and D2.

FIG. 16 compares the layer wear and the counter-body wear for layers A1 and D2. While A1 has low layer wear of value 2, D2 shows no layer wear. In addition, there is no wear of the aluminum oxide counter-body for both layers.

In summary, the following can be said for the SRV tests at higher temperatures:

SRV: lubricated with 100Cr6 as counter-body at higher temperatures

The coefficients of friction for all investigated layers show values around 0.2. At RT, the layers D1 and D2 have a value of about 0.18 and 0.16, respectively, which is significantly lower than that of A1 (0.20). At higher temperatures these differences disappear increasingly, although the layers on the basis of chromium oxide and aluminum chromium oxide still have the lowest coefficients of friction.

A1 shows low layer wear for all temperature ranges, whereas the oxide layers D1 and D2 show no layer wear. On the other hand, many non-oxidic layers are subject to wear.

With the exception of B1 and C2, there is only little wear on the counter-body. Here, the surface roughness of the layer, and probably also the run-in behavior of the tribo-system, play an important role. After a certain period of time, the counter-body wear stabilizes over the size of the contact surface.

SRV: lubricated with aluminum oxide as counter-body at higher temperatures

The coefficients of friction at RT are slightly lower and show a small increase for the higher temperatures. However, in all cases they are around 0.2, wherein the layers D1 and D2 on the basis of chromium oxide and aluminum chromium oxide are lower than in the case of A1.

Low layer wear occurs in the case of A1 at all temperatures, greater wear occurs in the case of B1. The layers on the basis of chromium oxide and aluminum chromium oxide have no wear.

No wear of the counter-body can be measured for all layers.

A tribological system 1 or 2 having bodies 105, 107 and counter-bodies 103, 111, which together form a tribological contact, has been described, the surface 108 of the body 105, 107 being coated with a first coating 12 at least in the region of contact and the surface 112 of the counter-body 103, 111 being coated with a second coating 11 at least in the region of contact, characterized in that at least one of the first and second coatings 12, 11 is a layer on the basis of chromium oxide or aluminum chromium oxide.

In the tribological system 1 or 2, the other layer 11, 12 can comprise a layer on the basis of Mo, MoN, MoCuN, DLC or ta-C.

In the tribological system 1 or 2, both the first and the second coating 12, 11 can comprise layers on the basis of chromium oxide or aluminum chromium oxide.

At least one of the coatings 12, 11 and preferably both coatings 12, 11 can have a chemical composition of $(Al_{1-x}Cr_{-y})_2O_3$, where $0.1 \leq x \leq 1$ and $y \leq 0.5$.

At least one of these coatings 12, 11 and preferably both coatings 12, 11 may have a hardness of 18 GPa or greater.

The tribological system can be part of an internal combustion engine 100, wherein the internal combustion engine is preferably designed for the combustion of gasoline, diesel or gas.

For example, the body can be a piston ring 103 and the counter-body can be e.g. a cylinder running surface 108. Preferably, other surfaces of the internal combustion engine 100 are coated with layers on the basis of chromium oxide or aluminum chromium oxide, especially cylinder ring grooves 104, the piston skirt (piston connector 111), piston connector slide way 113 and/or piston crown 109 are preferred.

TABLE 1a

Layers produced by thermal spraying methods and intended primarily for coating the cylinder running surface.

| Designation of the coating | Powder material | Chemical composition of the coating | Surface roughness Ra [μm] |
| --- | --- | --- | --- |
| A1 | Fe-based | e(bal.)-C(1.2 wt. %)—Mn(1.4 wt. %)—Cr(1.4 wt. %) | 0.5 |
| B1 | Titanium oxide | TiO2 | 0.25 |
| C1 | Ni-based | Ni(bal.)—CrWMoCuCB | 0.33 |
| D1 | Chromium oxide | Cr2O3 | 0.15 |
| E1 | Aluminum chromium oxide | (Al2O3(62 wt. %)—Cr2O3(38 wt. %) | 0.45 |

TABLE 1b

Layers produced by cathodic spark evaporation and intended primarily for coating the piston rings.

| Designation of the coating | Coating | Chemical composition of the coating | Surface roughness Ra [μm] |
|---|---|---|---|
| C2 | Aluminum chromium oxide | Al—Cr—O Example: (Al0.7Cr0.3)2O3 | Unpolished 0.4 |
| D2 | Aluminum chromium oxide | Al—Cr—O Example: (Al0.7Cr0.3)2O3 | Polished 0.15 |

TABLE 2

Description of the results obtained with the 100Cr6 and alumina counter-bodies in the SRV test under dry conditions.

| Designation of the coating | Coefficient of friction | | Layer wear | | Counter-body wear | |
|---|---|---|---|---|---|---|
| | 100Cr6 | Aluminum oxide | 100Cr6 | Aluminum oxide | 100Cr6 | Aluminum oxide |
| A1 | 0.86 | 0.73 | 2 | 4 | 4 | 1 |
| B1 | 0.82 | 1.04 | 1(—) | 5 | 4 | 1 |
| C1 | 0.79 | 0.74 | 4 | 4 | 3-4 | 1 |
| D1 | 0.66 | 0.66 | 1 | 1 | 4 | 1 |
| E1 | 0.78 | 0.78 | 1 | 5 | 4 | 1 |
| C2 | 0.76 | 0.56 | 1(—) | 1 | 4 | 1 |
| D2 | 0.76 | 0.56 | 1-2 | 1 | 3 | 1 |

TABLE 3

Description of the results obtained by the SRV test under lubricated conditions (lubricant oil1) with the 100Cr6 and alumina counter-bodies.

| Designation of the coating | Coefficient of friction | | Layer wear | | Counter-body wear | |
|---|---|---|---|---|---|---|
| | 100Cr6 | Aluminum oxide | 100Cr6 | Aluminum oxide | 100Cr6 | Aluminum oxide |
| A1 | 0.20 | 0.19 | 2 | 2 | 1-2 | 1 |
| B1 | 0.16 | 0.21 | 2 | 5 | 2 | 1-2 |
| C1 | 0.20 | 0.18 | 2 | 4 | 2 | 1-2 |
| D1 | 0.16 | 0.18 | 1 | 1 | 2 | 1 |
| E1 | 0.18 | 0.18 | 1 | 3 | 3 | 2 |
| C2 | 0.17 | 0.18 | 1 | 1 | 4 | 2 |
| D2 | 0.18 | 0.18 | 1 | 1 | 2 | 1 |

TABLE 4

Description of the results obtained by the SRV test under lubricated conditions (lubricant oil2) with the 100Cr6 and alumina counter-bodies as a function of temperature.

| Designation of the coating | Coefficient of friction | | Layer wear | | Counter-body wear | |
|---|---|---|---|---|---|---|
| | 100Cr6 | Aluminum oxide | 100Cr6 | Aluminum oxide | 100Cr6 | Aluminum oxide |
| RT | | | | | | |
| A1 | 0.21 | 0.20 | 2 | 2 | 2 | 1 |
| B1 | 0.20 | 0.19 | 4 | 3-4 | 3 | 2 |
| D1 | 0.18 | 0.18 | 2 | 9 | 2 | 1 |
| C2 | 0.18 | 0.20 | 1 | 1-2 | 3-4 | 1 |
| D2 | 0.16 | 0.16 | 1 | 1 | 1-2 | 1 |
| 100° C. | | | | | | |
| A1 | 0.21 | 0.21 | 2 | 2 | 2 | 1 |
| B1 | 0.22 | 0.21 | 3 | 3 | 2 | 1 |
| D1 | 0.19 | 0.20 | 1 | 1 | 1-2 | 1 |
| C2 | 0.19 | 0.19 | 1 | 1 | 3 | 1 |
| D2 | 0.18 | 0.18 | 1 | 1 | 1-2 | 1 |
| 160° C. | | | | | | |
| A1 | 0.21 | 0.21 | 2 | 2 | 2 | 1 |
| B1 | 0.21 | 0.21 | 3 | 3 | 2 | 1 |
| D1 | 0.20 | 0.20 | 1 | 1 | 2 | 1 |
| C2 | 0.20 | 0.20 | 1 | 1 | 3 | 1 |
| D2 | 0.19 | 0.19 | 1 | 1 | 1-2 | 1 |

The invention claimed is:

1. A tribological system comprising a piston and a cylinder, which each form a component of an internal combustion engine, wherein a surface of the piston comprises a first material area, wherein a surface of the cylinder comprises a second material area, wherein at least a portion of each of the first and second material areas are configured to come into contact with each other during operation and form a tribological contact, wherein the first material area is formed as a layer on the basis of a select one of chromium oxide and aluminum chromium oxide and wherein the second material area is a mixed alumina-chromium oxide layer having a composition of 10 wt % to below 100 wt % $Cr_2O_3$ and correspondingly more than 0 wt % and up to 90 wt % $Al_2O_3$.

2. The tribological system of claim 1, wherein the first material area is formed on at least a portion of a select one or more of a piston ring, a piston connector, a piston ring groove area, and a piston crown of the piston.

3. The tribological system of claim 1, wherein the second material area is formed on at least a portion of a cylinder liner of the cylinder.

4. The tribological system of claim 1, wherein the first and second material areas are each arranged on a surface of the piston and the cylinder forming a running surface, wherein the running surface comprises a select one or more of a piston shaft slide way, a ring running surface, and a cylinder slide way.

5. The tribological system of claim 1, wherein the first material area is a layer on the basis of aluminum chromium oxide having a chemical composition of $(Al_{1-x}Cr_{-y})_2O_3$, wherein: $0.1 \leq x \leq 1$ and $y \leq 0.5$.

6. The tribological system of claim 5, wherein $0.5 \leq x \leq 1$.

7. The tribological system of claim 5, wherein $x=0.7$ and $y=0.3$.

8. The tribological system of claim 1, wherein the first material area has a surface roughness (Ra) of 0.1 μm to 0.5 μm and the second material area has a surface roughness (Ra) of 0.1 μm to 0.5 μm.

9. The tribological system of claim 8, wherein the first material area has a surface roughness (Ra) of 0.15 μm to 0.4 μm.

10. The tribological system of claim 8, wherein the second material area has a surface roughness (Ra) of 0.15 μm to 0.45 μm.

11. The tribological system of claim 1, wherein a select one or both the first and second material areas is formed by a thermal spraying method.

12. The tribological system of claim 11, wherein a select one or both of the first and second material areas has a layer thickness between 150 μm and 800 μm.

13. The tribological system of claim 1, wherein a select one or both of the first and second material areas is formed by a physical vapor deposition (PVD) method.

14. The tribological system of claim 13, wherein the physical vapor deposition (PVD) method comprises cathodic spark evaporation.

15. The tribological system of claim 13, wherein a select one or both of the first and second material areas has a layer thickness of 10 μm and 30 μm.

16. The tribological system of claim 1, wherein the second material area is formed on the basis of a select one or more of Mo, MoN, MoCuN, DLC, and ta-C.

17. The tribological system of claim 1, wherein at least one of the first and second material areas has a hardness of at least about 18 GPa.

18. An internal combustion engine comprising:
a piston comprising a surface having a first material layer; and
a cylinder comprising a surface having a second material layer;
wherein at least a portion of the first material layer and the second material layer are in contact with each other during operation of the internal combustion engine to form a tribological contact, wherein the first material layer is formed on the basis of a select one of chromium oxide and aluminum chromium oxide and wherein the second material layer is a mixed alumina-chromium oxide layer having a composition of 10 wt % to below 100 wt % $Cr_2O_3$ and correspondingly more than 0 wt % and up to 90 wt % $Al_2O_3$.

19. A tribological system that comprises a first body and a second body, which each form a component of an internal combustion engine, wherein the first body comprises a first surface having a first material area, wherein the second body comprises a second surface having a second material area, wherein at least a portion of the first and second material areas are in contact with each other during operation of the internal combustion engine and form a tribological contact, wherein the first material area is formed on the basis of a select one of chromium oxide and aluminum chromium oxide and wherein the second material area is a mixed alumina-chromium oxide layer having a composition of 10 wt % to below 100 wt % $Cr_2O_3$ and correspondingly more than 0 wt % and up to 90 wt % $Al_2O_3$.

* * * * *

UNITED STATES PATENT AND TRADEMARK OFFICE
CERTIFICATE OF CORRECTION

PATENT NO. : 10,677,355 B2
APPLICATION NO. : 16/077235
DATED : June 9, 2020
INVENTOR(S) : Peter Ernst et al.

It is certified that error appears in the above-identified patent and that said Letters Patent is hereby corrected as shown below:

In the Specification

Column 8, Line 51 – reads "properties of which are described in derail above or below"; which should be deleted and replaced with "properties of which are described in detail above or below"

Column 11, Line 31 – reads "To characterize the layer wear in more derail, …"; which should be deleted and replaced with "To characterize the layer wear in more detail, …"

Signed and Sealed this
Eighteenth Day of August, 2020

Andrei Iancu
*Director of the United States Patent and Trademark Office*